United States Patent
Ohsawa

(10) Patent No.: US 7,626,879 B2
(45) Date of Patent: Dec. 1, 2009

(54) SEMICONDUCTOR MEMORY DEVICE

(75) Inventor: Takashi Ohsawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/041,293

(22) Filed: Mar. 3, 2008

(65) Prior Publication Data

US 2008/0232184 A1    Sep. 25, 2008

(30) Foreign Application Priority Data

Mar. 22, 2007   (JP) ............................ 2007-074757

(51) Int. Cl.
*G11C 7/00*   (2006.01)
(52) U.S. Cl. ...................................... 365/207; 365/149
(58) Field of Classification Search ................. 365/207, 365/205, 185.26, 189.04
See application file for complete search history.

(56) References Cited

U.S. PATENT DOCUMENTS

| 7,139,216 | B2 | 11/2006 | Higashi et al. | |
|---|---|---|---|---|
| 7,277,341 | B2 * | 10/2007 | Fujita et al. | ................. 365/206 |
| 7,301,838 | B2 * | 11/2007 | Waller et al. | ................. 365/205 |
| 7,539,041 | B2 * | 5/2009 | Kim et al. | ................. 365/149 |
| 2007/0127289 | A1 * | 6/2007 | Lee | ........................... 365/182 |

FOREIGN PATENT DOCUMENTS

| JP | 2005-251256 | 9/2005 |
|---|---|---|
| JP | 2005-302077 | 10/2005 |
| JP | 2005-302234 | 10/2005 |
| JP | 2007-73680 | 3/2007 |

* cited by examiner

*Primary Examiner*—Anh Phung
(74) *Attorney, Agent, or Firm*—Oblon, Spivak, McClelland, Maier & Neustadt, L.L.P.

(57) ABSTRACT

This disclosure concerns a memory comprising memory cells including floating bodies, logic data being stored in the memory cells; word lines connected to gates of the memory cells; bit lines connected to the memory cells; and sense amplifiers connected to the bit lines, and applying a first voltage to the bit lines when first logic data is written to the memory cells connected to the bit lines, wherein the sense amplifiers apply a second voltage to the memory cells having stored therein the first logic data during a refresh operation in which at least second logic data stored in the memory cells is recovered, the second logic data is opposite in logic to the first logic data, and the second voltage is lower in absolute value than the first voltage and equal to or higher in absolute value than a potential of sources of the memory cells.

11 Claims, 18 Drawing Sheets

ACTIVATION COUNTER AC

SAP DRIVER SAPD

BSAN DRIVER

| NUMBER OF REFRESH OPERATIONS | | | | A0 | A1 | A2 | B0 | B1 | |
|---|---|---|---|---|---|---|---|---|---|
| PREF | 1 | WL0 | BSAP=$V_{BLL}$ | 0 | 0 | 0 | 0 | 0 | SAP=$V_{BLH}$ |
| | | WL1 | BSAP=$V_{BLL}$ | 1 | 0 | 0 | 0 | 0 | SAP=$V_{BLH}$ |
| | | WL2 | BSAP=$V_{BLL}$ | 0 | 1 | 0 | 0 | 0 | SAP=$V_{BLH}$ |
| | | WL3 | BSAP=$V_{BLL}$ | 1 | 1 | 0 | 0 | 0 | SAP=$V_{BLH}$ |
| | | WL4 | BSAP=$V_{BLL}$ | 0 | 0 | 1 | 0 | 0 | SAP=$V_{BLH}$ |
| | | WL5 | BSAP=$V_{BLL}$ | 1 | 0 | 1 | 0 | 0 | SAP=$V_{BLH}$ |
| | | WL6 | BSAP=$V_{BLL}$ | 0 | 1 | 1 | 0 | 0 | SAP=$V_{BLH}$ |
| | | WL7 | BSAP=$V_{BLL}$ | 1 | 1 | 1 | 0 | 0 | SAP=$V_{BLH}$ |
| NREF | 2 | WL0 | BSAP=$V_{BLL}$ | 0 | 0 | 0 | 1 | 0 | SAP=$V_{BLHREF}$ |
| | | WL1 | BSAP=$V_{BLL}$ | 1 | 0 | 0 | 1 | 0 | SAP=$V_{BLHREF}$ |
| | | WL2 | BSAP=$V_{BLL}$ | 0 | 1 | 0 | 1 | 0 | SAP=$V_{BLHREF}$ |
| | | WL3 | BSAP=$V_{BLL}$ | 1 | 1 | 0 | 1 | 0 | SAP=$V_{BLHREF}$ |
| | | WL4 | BSAP=$V_{BLL}$ | 0 | 0 | 1 | 1 | 0 | SAP=$V_{BLHREF}$ |
| | | WL5 | BSAP=$V_{BLL}$ | 1 | 0 | 1 | 1 | 0 | SAP=$V_{BLHREF}$ |
| | | WL6 | BSAP=$V_{BLL}$ | 0 | 1 | 1 | 1 | 0 | SAP=$V_{BLHREF}$ |
| | | WL7 | BSAP=$V_{BLL}$ | 1 | 1 | 1 | 1 | 0 | SAP=$V_{BLHREF}$ |
| NREF | 3 | WL0 | BSAP=$V_{BLL}$ | 0 | 0 | 0 | 0 | 1 | SAP=$V_{BLHREF}$ |
| | | WL1 | BSAP=$V_{BLL}$ | 1 | 0 | 0 | 0 | 1 | SAP=$V_{BLHREF}$ |
| | | WL2 | BSAP=$V_{BLL}$ | 0 | 1 | 0 | 0 | 1 | SAP=$V_{BLHREF}$ |
| | | WL3 | BSAP=$V_{BLL}$ | 1 | 1 | 0 | 0 | 1 | SAP=$V_{BLHREF}$ |
| | | WL4 | BSAP=$V_{BLL}$ | 0 | 0 | 1 | 0 | 1 | SAP=$V_{BLHREF}$ |
| | | WL5 | BSAP=$V_{BLL}$ | 1 | 0 | 1 | 0 | 1 | SAP=$V_{BLHREF}$ |
| | | WL6 | BSAP=$V_{BLL}$ | 0 | 1 | 1 | 0 | 1 | SAP=$V_{BLHREF}$ |
| | | WL7 | BSAP=$V_{BLL}$ | 1 | 1 | 1 | 0 | 1 | SAP=$V_{BLHREF}$ |
| NREF | 4 | WL0 | BSAP=$V_{BLL}$ | 0 | 0 | 0 | 1 | 1 | SAP=$V_{BLHREF}$ |
| | | WL1 | BSAP=$V_{BLL}$ | 1 | 0 | 0 | 1 | 1 | SAP=$V_{BLHREF}$ |
| | | WL2 | BSAP=$V_{BLL}$ | 0 | 1 | 0 | 1 | 1 | SAP=$V_{BLHREF}$ |
| | | WL3 | BSAP=$V_{BLL}$ | 1 | 1 | 0 | 1 | 1 | SAP=$V_{BLHREF}$ |
| | | WL4 | BSAP=$V_{BLL}$ | 0 | 0 | 1 | 1 | 1 | SAP=$V_{BLHREF}$ |
| | | WL5 | BSAP=$V_{BLL}$ | 1 | 0 | 1 | 1 | 1 | SAP=$V_{BLHREF}$ |
| | | WL6 | BSAP=$V_{BLL}$ | 0 | 1 | 1 | 1 | 1 | SAP=$V_{BLHREF}$ |
| | | WL7 | BSAP=$V_{BLL}$ | 1 | 1 | 1 | 1 | 1 | SAP=$V_{BLHREF}$ |
| PREF | 5 | WL0 | BSAP=$V_{BLL}$ | 0 | 0 | 0 | 0 | 0 | SAP=$V_{BLH}$ |
| | | WL1 | BSAP=$V_{BLL}$ | 1 | 0 | 0 | 0 | 0 | SAP=$V_{BLH}$ |
| | | WL2 | BSAP=$V_{BLL}$ | 0 | 1 | 0 | 0 | 0 | SAP=$V_{BLH}$ |
| | | WL3 | BSAP=$V_{BLL}$ | 1 | 1 | 0 | 0 | 0 | SAP=$V_{BLH}$ |
| | | WL4 | BSAP=$V_{BLL}$ | 0 | 0 | 1 | 0 | 0 | SAP=$V_{BLH}$ |
| | | WL5 | BSAP=$V_{BLL}$ | 1 | 0 | 1 | 0 | 0 | SAP=$V_{BLH}$ |
| | | WL6 | BSAP=$V_{BLL}$ | 0 | 1 | 1 | 0 | 0 | SAP=$V_{BLH}$ |
| | | WL7 | BSAP=$V_{BLL}$ | 1 | 1 | 1 | 0 | 0 | SAP=$V_{BLH}$ |
| NREF | 6 | WL0 | BSAP=$V_{BLL}$ | 0 | 0 | 0 | 1 | 0 | SAP=$V_{BLHREF}$ |
| | | WL1 | BSAP=$V_{BLL}$ | 1 | 0 | 0 | 1 | 0 | SAP=$V_{BLHREF}$ |
| | | WL2 | BSAP=$V_{BLL}$ | 0 | 1 | 0 | 1 | 0 | SAP=$V_{BLHREF}$ |
| | | WL3 | BSAP=$V_{BLL}$ | 1 | 1 | 0 | 1 | 0 | SAP=$V_{BLHREF}$ |
| | | WL4 | BSAP=$V_{BLL}$ | 0 | 0 | 1 | 1 | 0 | SAP=$V_{BLHREF}$ |
| | | WL5 | BSAP=$V_{BLL}$ | 1 | 0 | 1 | 1 | 0 | SAP=$V_{BLHREF}$ |
| | | WL6 | BSAP=$V_{BLL}$ | 0 | 1 | 1 | 1 | 0 | SAP=$V_{BLHREF}$ |
| | | WL7 | BSAP=$V_{BLL}$ | 1 | 1 | 1 | 1 | 0 | SAP=$V_{BLHREF}$ |
| NREF | 7 | WL0 | BSAP=$V_{BLL}$ | 0 | 0 | 0 | 0 | 1 | SAP=$V_{BLHREF}$ |
| | | WL1 | BSAP=$V_{BLL}$ | 1 | 0 | 0 | 0 | 1 | SAP=$V_{BLHREF}$ |
| | | WL2 | BSAP=$V_{BLL}$ | 0 | 1 | 0 | 0 | 1 | SAP=$V_{BLHREF}$ |
| | | WL3 | BSAP=$V_{BLL}$ | 1 | 1 | 0 | 0 | 1 | SAP=$V_{BLHREF}$ |
| | | WL4 | BSAP=$V_{BLL}$ | 0 | 0 | 1 | 0 | 1 | SAP=$V_{BLHREF}$ |
| | | WL5 | BSAP=$V_{BLL}$ | 1 | 0 | 1 | 0 | 1 | SAP=$V_{BLHREF}$ |
| | | WL6 | BSAP=$V_{BLL}$ | 0 | 1 | 1 | 0 | 1 | SAP=$V_{BLHREF}$ |
| | | WL7 | BSAP=$V_{BLL}$ | 1 | 1 | 1 | 0 | 1 | SAP=$V_{BLHREF}$ |
| NREF | 8 | WL0 | BSAP=$V_{BLL}$ | 0 | 0 | 0 | 1 | 1 | SAP=$V_{BLHREF}$ |
| | | WL1 | BSAP=$V_{BLL}$ | 1 | 0 | 0 | 1 | 1 | SAP=$V_{BLHREF}$ |
| | | WL2 | BSAP=$V_{BLL}$ | 0 | 1 | 0 | 1 | 1 | SAP=$V_{BLHREF}$ |
| | | WL3 | BSAP=$V_{BLL}$ | 1 | 1 | 0 | 1 | 1 | SAP=$V_{BLHREF}$ |
| | | WL4 | BSAP=$V_{BLL}$ | 0 | 0 | 1 | 1 | 1 | SAP=$V_{BLHREF}$ |

FIG. 8

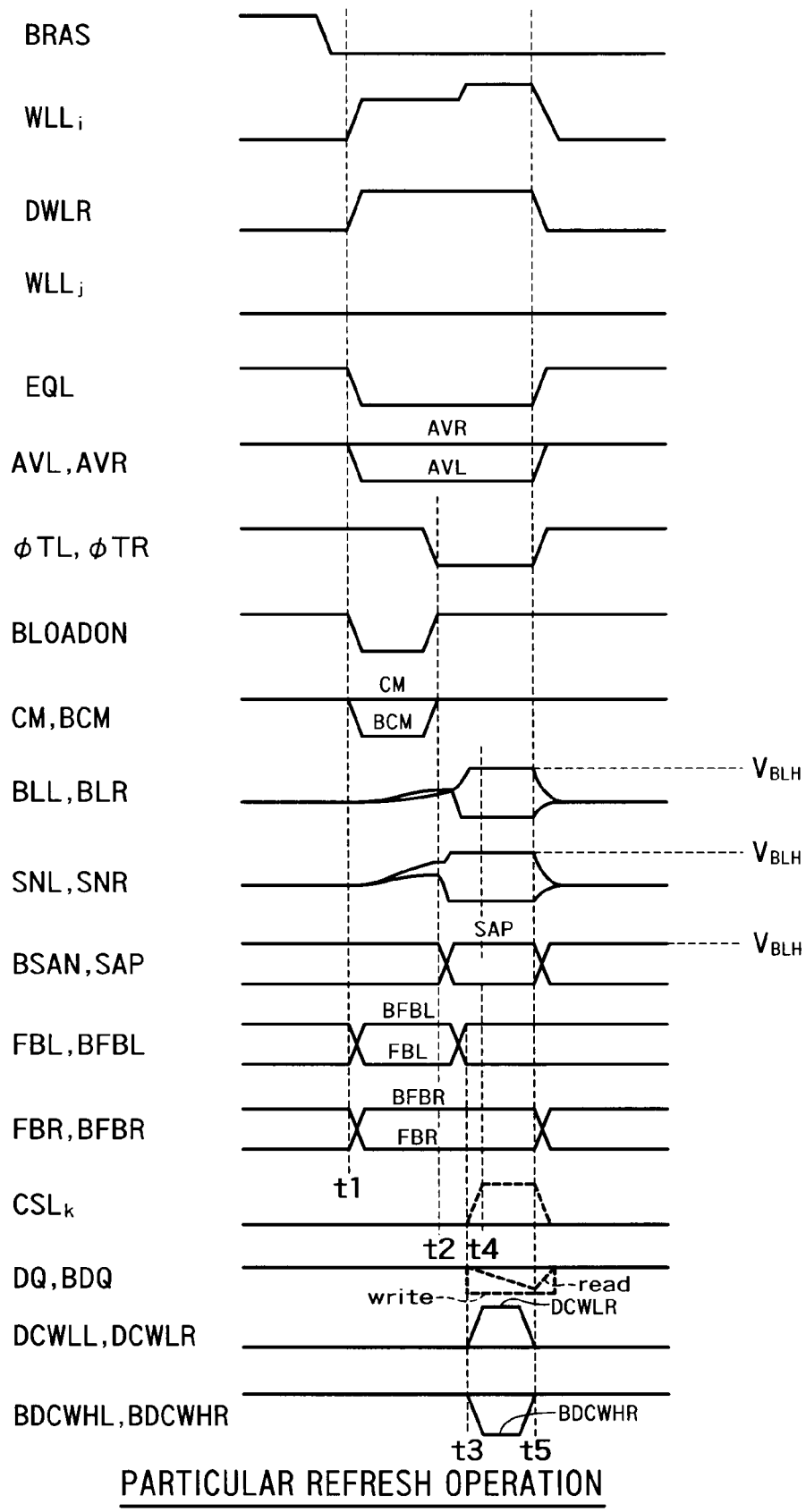
FIG. 9 — PARTICULAR REFRESH OPERATION

| | | | A0 | A1 | A2 | B1 | B1 | | |
|---|---|---|---|---|---|---|---|---|---|
| 1 | WL0 | BSAP=$V_{BLL}$ | 0 | 0 | 0 | 0 | 0 | SAP=$V_{BLH}$ | ←PREF |
| | WL1 | BSAP=$V_{BLL}$ | 1 | 0 | 0 | 0 | 0 | SAP=$V_{BLHREF}$ | |
| | WL2 | BSAP=$V_{BLL}$ | 0 | 1 | 0 | 0 | 0 | SAP=$V_{BLHREF}$ | |
| | WL3 | BSAP=$V_{BLL}$ | 1 | 1 | 0 | 0 | 0 | SAP=$V_{BLHREF}$ | |
| | WL4 | BSAP=$V_{BLL}$ | 0 | 0 | 1 | 0 | 0 | SAP=$V_{BLH}$ | ←PREF |
| | WL5 | BSAP=$V_{BLL}$ | 1 | 0 | 1 | 0 | 0 | SAP=$V_{BLHREF}$ | |
| | WL6 | BSAP=$V_{BLL}$ | 0 | 1 | 1 | 0 | 0 | SAP=$V_{BLHREF}$ | |
| | WL7 | BSAP=$V_{BLL}$ | 1 | 1 | 1 | 0 | 0 | SAP=$V_{BLHREF}$ | |
| 2 | WL0 | BSAP=$V_{BLL}$ | 0 | 0 | 0 | 1 | 0 | SAP=$V_{BLHREF}$ | |
| | WL1 | BSAP=$V_{BLL}$ | 1 | 0 | 0 | 1 | 0 | SAP=$V_{BLH}$ | ←PREF |
| | WL2 | BSAP=$V_{BLL}$ | 0 | 1 | 0 | 1 | 0 | SAP=$V_{BLHREF}$ | |
| | WL3 | BSAP=$V_{BLL}$ | 1 | 1 | 0 | 1 | 0 | SAP=$V_{BLHREF}$ | |
| | WL4 | BSAP=$V_{BLL}$ | 0 | 0 | 1 | 1 | 0 | SAP=$V_{BLHREF}$ | |
| | WL5 | BSAP=$V_{BLL}$ | 1 | 0 | 1 | 1 | 0 | SAP=$V_{BLH}$ | ←PREF |
| | WL6 | BSAP=$V_{BLL}$ | 0 | 1 | 1 | 1 | 0 | SAP=$V_{BLHREF}$ | |
| | WL7 | BSAP=$V_{BLL}$ | 1 | 1 | 1 | 1 | 0 | SAP=$V_{BLHREF}$ | |
| 3 | WL0 | BSAP=$V_{BLL}$ | 0 | 0 | 0 | 0 | 1 | SAP=$V_{BLHREF}$ | |
| | WL1 | BSAP=$V_{BLL}$ | 1 | 0 | 0 | 0 | 1 | SAP=$V_{BLHREF}$ | |
| | WL2 | BSAP=$V_{BLL}$ | 0 | 1 | 0 | 0 | 1 | SAP=$V_{BLH}$ | ←PREF |
| | WL3 | BSAP=$V_{BLL}$ | 1 | 1 | 0 | 0 | 1 | SAP=$V_{BLHREF}$ | |
| | WL4 | BSAP=$V_{BLL}$ | 0 | 0 | 1 | 0 | 1 | SAP=$V_{BLHREF}$ | |
| | WL5 | BSAP=$V_{BLL}$ | 1 | 0 | 1 | 0 | 1 | SAP=$V_{BLHREF}$ | |
| | WL6 | BSAP=$V_{BLL}$ | 0 | 1 | 1 | 0 | 1 | SAP=$V_{BLH}$ | ←PREF |
| | WL7 | BSAP=$V_{BLL}$ | 1 | 1 | 1 | 0 | 1 | SAP=$V_{BLHREF}$ | |
| 4 | WL0 | BSAP=$V_{BLL}$ | 0 | 0 | 0 | 1 | 1 | SAP=$V_{BLHREF}$ | |
| | WL1 | BSAP=$V_{BLL}$ | 1 | 0 | 0 | 1 | 1 | SAP=$V_{BLHREF}$ | |
| | WL2 | BSAP=$V_{BLL}$ | 0 | 1 | 0 | 1 | 1 | SAP=$V_{BLHREF}$ | |
| | WL3 | BSAP=$V_{BLL}$ | 1 | 1 | 0 | 1 | 1 | SAP=$V_{BLH}$ | ←PREF |
| | WL4 | BSAP=$V_{BLL}$ | 0 | 0 | 1 | 1 | 1 | SAP=$V_{BLHREF}$ | |
| | WL5 | BSAP=$V_{BLL}$ | 1 | 0 | 1 | 1 | 1 | SAP=$V_{BLHREF}$ | |
| | WL6 | BSAP=$V_{BLL}$ | 0 | 1 | 1 | 1 | 1 | SAP=$V_{BLHREF}$ | |
| | WL7 | BSAP=$V_{BLL}$ | 1 | 1 | 1 | 1 | 1 | SAP=$V_{BLH}$ | ←PREF |
| 5 | WL0 | BSAP=$V_{BLL}$ | 0 | 0 | 0 | 0 | 0 | SAP=$V_{BLH}$ | ←PREF |
| | WL1 | BSAP=$V_{BLL}$ | 1 | 0 | 0 | 0 | 0 | SAP=$V_{BLHREF}$ | |
| | WL2 | BSAP=$V_{BLL}$ | 0 | 1 | 0 | 0 | 0 | SAP=$V_{BLHREF}$ | |
| | WL3 | BSAP=$V_{BLL}$ | 1 | 1 | 0 | 0 | 0 | SAP=$V_{BLHREF}$ | |
| | WL4 | BSAP=$V_{BLL}$ | 0 | 0 | 1 | 0 | 0 | SAP=$V_{BLH}$ | ←PREF |
| | WL5 | BSAP=$V_{BLL}$ | 1 | 0 | 1 | 0 | 0 | SAP=$V_{BLHREF}$ | |
| | WL6 | BSAP=$V_{BLL}$ | 0 | 1 | 1 | 0 | 0 | SAP=$V_{BLHREF}$ | |
| | WL7 | BSAP=$V_{BLL}$ | 1 | 1 | 1 | 0 | 0 | SAP=$V_{BLHREF}$ | |
| 6 | WL0 | BSAP=$V_{BLL}$ | 0 | 0 | 0 | 1 | 0 | SAP=$V_{BLHREF}$ | |
| | WL1 | BSAP=$V_{BLL}$ | 1 | 0 | 0 | 1 | 0 | SAP=$V_{BLH}$ | ←PREF |
| | WL2 | BSAP=$V_{BLL}$ | 0 | 1 | 0 | 1 | 0 | SAP=$V_{BLHREF}$ | |
| | WL3 | BSAP=$V_{BLL}$ | 1 | 1 | 0 | 1 | 0 | SAP=$V_{BLHREF}$ | |
| | WL4 | BSAP=$V_{BLL}$ | 0 | 0 | 1 | 1 | 0 | SAP=$V_{BLHREF}$ | |
| | WL5 | BSAP=$V_{BLL}$ | 1 | 0 | 1 | 1 | 0 | SAP=$V_{BLH}$ | ←PREF |
| | WL6 | BSAP=$V_{BLL}$ | 0 | 1 | 1 | 1 | 0 | SAP=$V_{BLHREF}$ | |
| | WL7 | BSAP=$V_{BLL}$ | 1 | 1 | 1 | 1 | 0 | SAP=$V_{BLHREF}$ | |
| 7 | WL0 | BSAP=$V_{BLL}$ | 0 | 0 | 0 | 0 | 1 | SAP=$V_{BLHREF}$ | |
| | WL1 | BSAP=$V_{BLL}$ | 1 | 0 | 0 | 0 | 1 | SAP=$V_{BLHREF}$ | |
| | WL2 | BSAP=$V_{BLL}$ | 0 | 1 | 0 | 0 | 1 | SAP=$V_{BLH}$ | ←PREF |
| | WL3 | BSAP=$V_{BLL}$ | 1 | 1 | 0 | 0 | 1 | SAP=$V_{BLHREF}$ | |
| | WL4 | BSAP=$V_{BLL}$ | 0 | 0 | 1 | 0 | 1 | SAP=$V_{BLHREF}$ | |
| | WL5 | BSAP=$V_{BLL}$ | 1 | 0 | 1 | 0 | 1 | SAP=$V_{BLHREF}$ | |
| | WL6 | BSAP=$V_{BLL}$ | 0 | 1 | 1 | 0 | 1 | SAP=$V_{BLH}$ | ←PREF |
| | WL7 | BSAP=$V_{BLL}$ | 1 | 1 | 1 | 0 | 1 | SAP=$V_{BLHREF}$ | |
| 8 | WL0 | BSAP=$V_{BLL}$ | 0 | 0 | 0 | 1 | 1 | SAP=$V_{BLHREF}$ | |
| | WL1 | BSAP=$V_{BLL}$ | 1 | 0 | 0 | 1 | 1 | SAP=$V_{BLHREF}$ | |
| | WL2 | BSAP=$V_{BLL}$ | 0 | 1 | 0 | 1 | 1 | SAP=$V_{BLHREF}$ | |
| | WL3 | BSAP=$V_{BLL}$ | 1 | 1 | 0 | 1 | 1 | SAP=$V_{BLH}$ | ←PREF |
| | WL4 | BSAP=$V_{BLL}$ | 0 | 0 | 1 | 1 | 1 | SAP=$V_{BLHREF}$ | |

FIG. 12

SEMICONDUCTOR MEMORY DEVICE

CROSS-REFERENCE TO RELATED APPLICATIONS

This application is based upon and claims the benefit of priority from the prior Japanese Patent Applications No. 2007-74757, filed on Mar. 22, 2007, the entire contents of which are incorporated herein by reference.

BACKGROUND OF THE INVENTION

1. Field of the Invention

The present invention relates to a semiconductor memory device, for example, an FBC (Floating Body Cell) memory device storing information by accumulating majority carriers in a floating body of each field effect transistor.

2. Related Art

In recent years, there is known an FBC memory device as a semiconductor memory device expected to replace a 1T (Transistor)-1C (Capacitor) DRAM. The FBC memory device is configured so that FETs (Field Effect Transistors) each including a floating body (hereinafter, also "body") are formed on an SOI (Silicon On Insulator) substrate, and so that data "1" or "0" is stored in each FET according to the number of majority carriers accumulated in the body of the FET.

It is defined in an FBC memory device including N-type FETs, for example, that a state in which the number of holes accumulated in a body is large is data "1" and a state in which the number of holes accumulated therein is small is data "0". In this case, since a potential of one word line is reduced to a negative potential in a data holding state, holes are caused to flow into the body of each N-type FET. After data is written, if the data holding state is long, the number of holes flowing into the body is large, resulting in deterioration in data "0". It is, therefore, necessary to regularly perform a refresh operation on each of memory cells storing therein data "0" (hereinafter, also "0 cells"). On the other hand, since each of memory cells storing therein data "1" (hereinafter, also "1" cells) corresponds to the state in which the number of holes is large, the "1" cells are not deteriorated in the data holding state.

However, if a selected word line is activated during a data read or write operation, a phenomenon occurs that the number of holes accumulated in bodies of unselected memory cells connected to the selected word line gradually decreases. This is referred to as "charge pumping phenomenon". If the charge pumping phenomenon repeatedly occurs, data "1" stored in the unselected memory cells is changed to data "0". To deal with this disadvantage, it is necessary to perform a refresh operation for supplying holes to the unselected memory cells storing therein the data "1".

Nevertheless, the conventional technique has the following disadvantages. A refresh operation on "1" cells and that on "0" cells are executed simultaneously on regular basis. Due to this, even if there is no need to perform a refresh operation on "1" cells, the refresh operation is performed on both "1" cells and "0" cells. In this case, deterioration in the "1" cells does not always occur simultaneously with that in the "0" cells, so that power is wasted in the refresh operation.

SUMMARY OF THE INVENTION

A semiconductor memory device according to an embodiment of the present invention comprises a plurality of memory cells including floating bodies in an electrically floating state, logic data according to the number of carriers accumulated in the floating bodies being stored in the memory cells; a plurality of word lines connected to gates of the memory cells; a plurality of bit lines connected to the memory cells and transmitting data stored in the memory cells; and a plurality of sense amplifiers connected to the bit lines, and applying a first voltage to the bit lines when first logic data is written to the memory cells connected to the bit lines, wherein the sense amplifiers apply a second voltage to the memory cells having stored therein the first logic data during a refresh operation in which at least second logic data stored in the memory cells is recovered, the second logic data is opposite in logic to the first logic data, and the second voltage is lower in absolute value than the first voltage and equal to or higher in absolute value than a potential of sources of the memory cells.

A semiconductor memory device according to another embodiment of the present invention comprises a plurality of memory cells including floating bodies in an electrically floating state, logic data according to number of carries accumulated in the floating bodies being stored in the memory cells; a plurality of word lines connected to gates of the memory cells; a plurality of bit lines connected to the memory cells and transmitting data stored in the memory cells; a plurality of sense amplifiers connected to the bit lines, reading the data from the memory cells or writing the data to the memory cells; a counter calculating an activation count of the word lines in a refresh operation, the refresh operation being an operation temporarily reading the data from the memory cells and writing back logic data identical to the read data to the memory cells, wherein if the activation count of the word lines is smaller than a predetermined value in the refresh operation, the sense amplifiers do not write back first logic data to the memory cells storing therein the first logic data, but write back second logic data opposite in logic to the first logic data to the memory cells storing therein the second logic data, and if the activation count of the word lines reaches the predetermined value in the refresh operation, the sense amplifiers write back the first logic data to the memory cells storing therein the first logic data and write back the second logic data to the memory cells storing therein the second logic data.

BRIEF DESCRIPTION OF THE DRAWINGS

FIG. 8 is a table showing the difference between the normal refresh operation and the particular refresh operation;

FIG. 9 is a timing chart showing the particular refresh operation, the normal data read operation or the normal data write operation;

FIG. 12 is a table showing the difference between the normal refresh operation and the particular refresh operation according to the second embodiment;

DETAILED DESCRIPTION OF THE INVENTION

Embodiments of the present invention will be explained below in detail with reference to the accompanying drawings. Note that the invention is not limited thereto.

First Embodiment

Figure 1A:
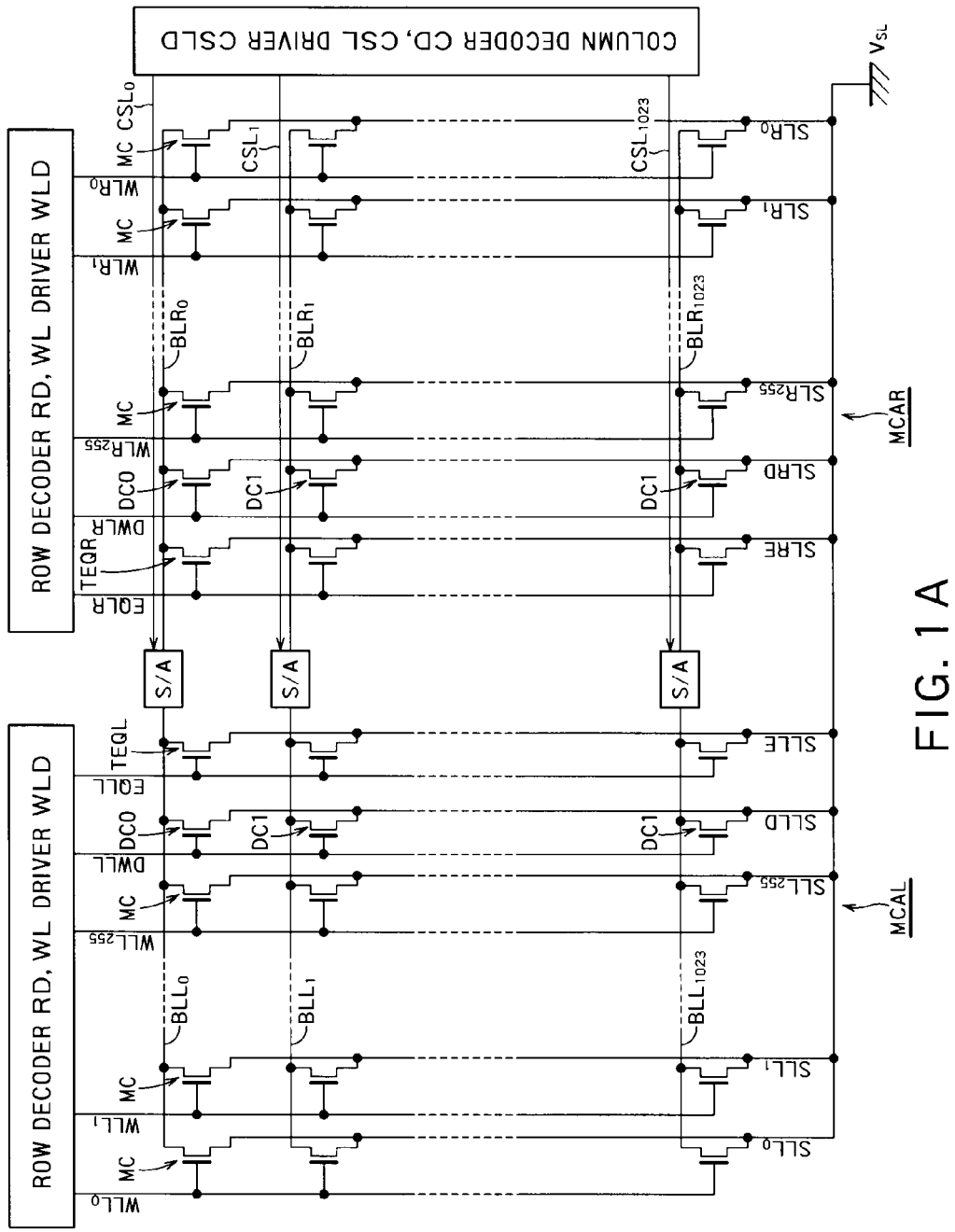
FIGS. 1A and 1B show a configuration of an FBC memory device according to a first embodiment of the present invention.
Figure 1B:
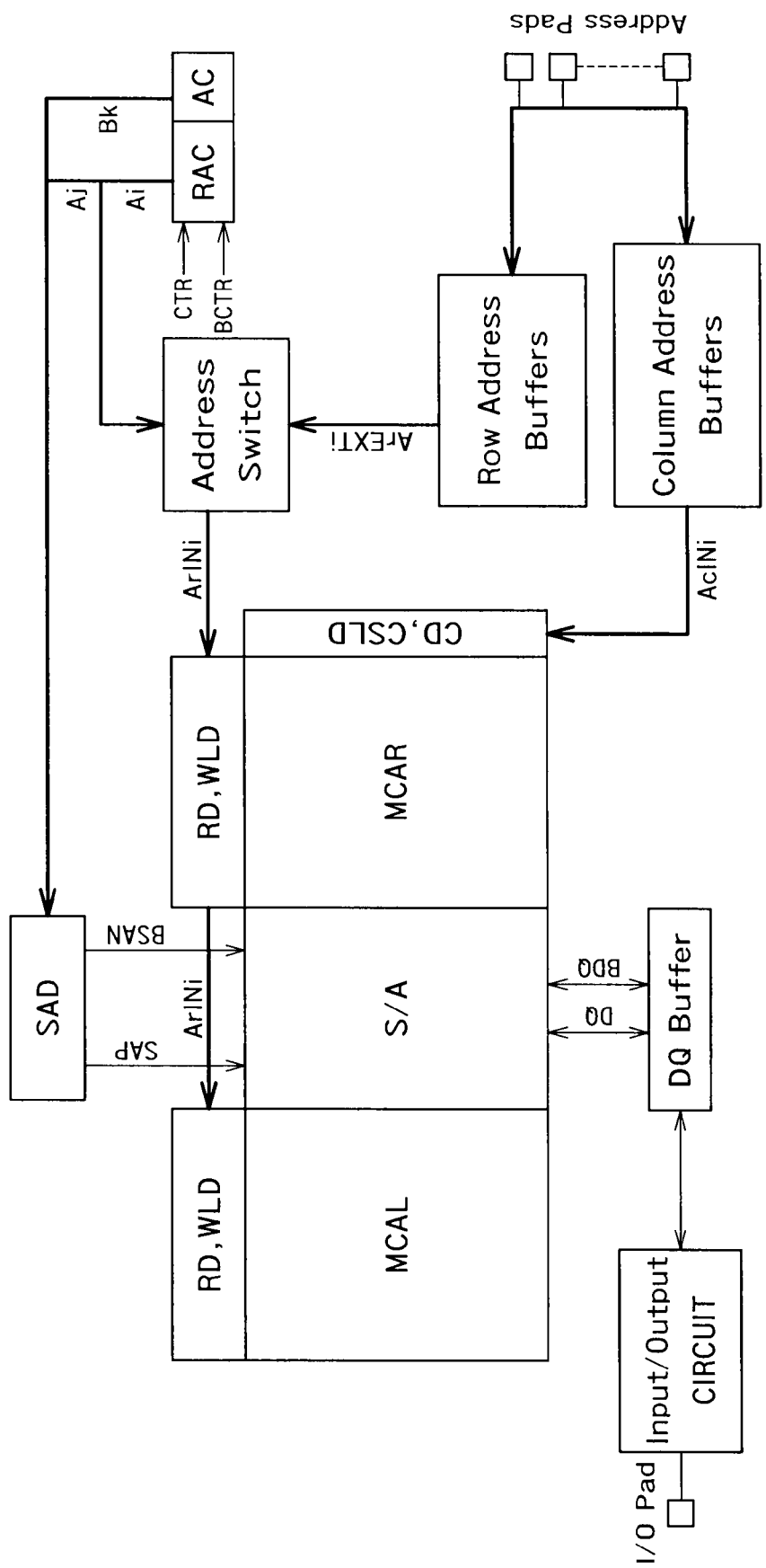

FIGS. 1A and 1B show a configuration of an FBC memory device according to a first embodiment of the present invention. The FBC memory device includes memory cells MCs, dummy cells DC0 and DC1 (hereinafter, also "DCs"), word lines WLLi and WLRi (where i is an integer) (hereinafter, also "WLs"), dummy word lines DWLL and DWLR (hereinafter, also "DWLs"), bit lines BLLi and BLRi (hereinafter, also "BLs"), sense amplifiers S/As, equalizing lines EQLL and EQLR (hereinafter, also "EQLs"), equalizing transistors TEQLs and TEQRs (hereinafter, also "TEQs"), row decoders RDs, WL drivers WLDs, a column decoder CD, a CSL driver CSLD, a row address counter RAC, an activation counter AC, and a sense amplifier driver SAD.

The memory cells MCs are arranged in a matrix and constitute memory cell arrays MCAL and MCAR (hereinafter, also "MCAs"). Each of the word lines WLs extends in a row direction and is connected to a gate of each memory cell MC. The number of word lines WLs provided on each of the left and right of the sense amplifiers S/As is 256. In FIG. 1A, 256 word lines on the left are denoted by WLL0 to WLL255 and those on the right are denoted by WLR0 to WLR255. Each of the bit lines BLs extends in a column direction and is connected to a source or a drain of each memory cell MC. The number of bit lines BLs provided on each of the left and right of the sense amplifiers S/As is 1024. In FIG. 1A, 1024 bit lines on the left are denoted by BLL0 to BLL1023 and those on the right are denoted by BLR0 to BLR1023. The word lines WLs are orthogonal to the bit lines BLs and the memory cells MCs are provided at respective cross points between the word lines WLs and the bit lines BLs. The memory cells MCs are, therefore, called "cross-point cells". Note that the row direction and the column direction can be replaced by each other.

Before a data read or write operation, the dummy cells DC0 and DC1 store therein data "0" and data "1" having reverse polarities with respect to each other, respectively. Normally, the data is written to each of the dummy cells DC0 and DC1 right after power is turned on or data is written to the associated cell array. A polarity indicates a logic value "0" or "1" of data. The dummy cells DC0 and DC1 are used to generate a reference current Iref when data stored in each memory cell MC is to be detected. The reference current Iref is almost intermediate between a current carried across each "0" cell and a current carried across each "1" cell. A current mirror circuit CMC (see FIG. 3) included in each sense amplifier S/A applies a current to each memory cell MC via the corresponding bit line BL. A current according to the data stored in the memory cell MC is thereby carried across a sense node in the sense amplifier S/A. The sense amplifier S/A discriminates whether the logic value of the data is "0" or "1" depending on whether the current carried across the sense node is lower or higher than the reference current Iref.

The dummy cells DC0 and DC1 are alternately arranged in an extension direction of the word lines WLs (a row direction). To generate the reference current Iref, the dummy cells DC0 are provided to be as many as the dummy cells DC1.

Each of the dummy word lines DWLs extends in the row direction, and is connected to a gate of each of the dummy cells DC0 and DC1. One dummy word line DWL is provided on each of the left and right of the sense amplifiers S/As.

Each of the equalizing lines EQLs is connected to a gate of each of the equalizing transistors TEQs. Each of the equalizing transistors TEQs is connected between one bit line BL and a ground (VSL). In an equalizing operation, the bit line BL is connected to the ground, thereby equalizing a potential of the bit line BL to a ground potential.

Each of the row decoders RDs decodes a row address so as to select a specific word line WL from among a plurality of word lines WLs. Each of the word line drivers WLDs activates this selected word line WL by applying a voltage to the selected word line WL. The column decoder CD decodes a column address so as to select a specific column from among a plurality of columns. The CSL driver CSLD applies a potential to a column selection line CSL (see FIG. 3) corresponding to the selected column, thereby reading data from the sense amplifier S/A corresponding to the column selection line CSL via a DQ buffer to outside of the memory deice.

The row address counter RAC generates a row address in response to signals CTR and BCTR activated when a refresh operation is executed regularly. Normally, in the refresh operation, the word lines WLs are selected in order of row addresses and the memory cells MCs connected to the selected word lines WLs are subjected to the refresh operation. Due to this, the row address counter RAC is configured to increment the row address whenever a refresh operation on a certain word line WL is finished.

The activation counter AC counts the number of times of activation (hereinafter, "activation count") of one word line WL during the refresh operation. If this activation count reaches a predetermined value, the activation counter circuit AC transmits a signal to the sense amplifier driver SAD, as shown in FIG. 1B, so as to perform the refresh operation on both the "0" cells and the "1" cells. The sense amplifier driver SAD is configured to include an SAP driver SAPD and a BSAN driver BSAND.

Figure 7:
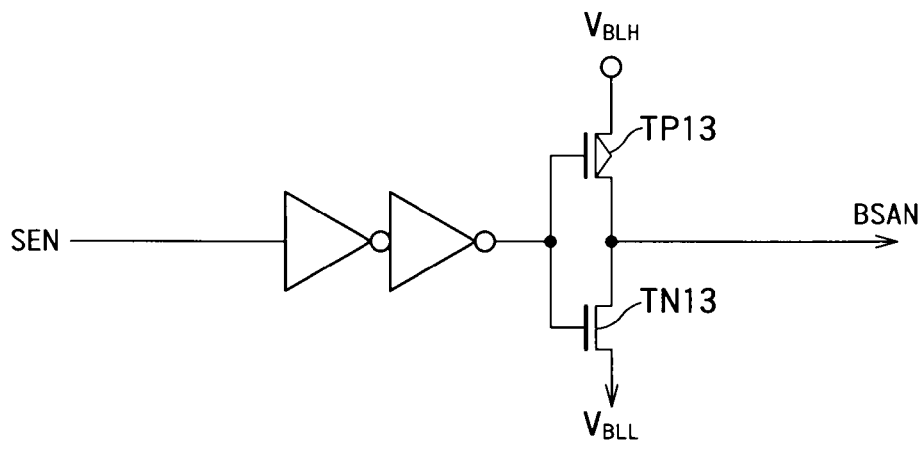
FIG. 7 is a circuit diagram of the BSAN driver.

The SAP driver SAPD is configured to activate a signal SAP (see FIG. 3) so as to perform a refresh operation on the "1" cells in response to the signal from the activation counter AC. Since the "0" cells are always restored in the refresh operation, a signal BSAN (see FIG. 3) is activated as usual. Namely, if the activation count is smaller than a predetermined value, then only the "0" cells are refreshed and the "1" cells are not refreshed in the refresh operation. If the activation count reaches the predetermined value, both the "0" cells and the "1" cells are activated in the refresh operation. The row address counter RAC, the activation counter AC, and the SAP driver SAPD will be described later in detail. Although not shown in FIG. 1A, the BSAN driver is shown in FIG. 7 in detail.

The word "activate" means to turn on or drive an element or a circuit, and the word "deactivate" means to turn off or stop an element or a circuit. Therefore, it is to be noted that a HIGH (high potential level) signal is an activation signal on one occasion and a LOW (low potential level) signal is an activation signal on another occasion. For example, an NMOS transistor is activated by making a potential of a gate of the NMOS transistor HIGH. A PMOS transistor is activated by making a potential of a gate of the PMOS transistor LOW. The activation count is the number of times of selectively activating a certain word line.

Figure 2:
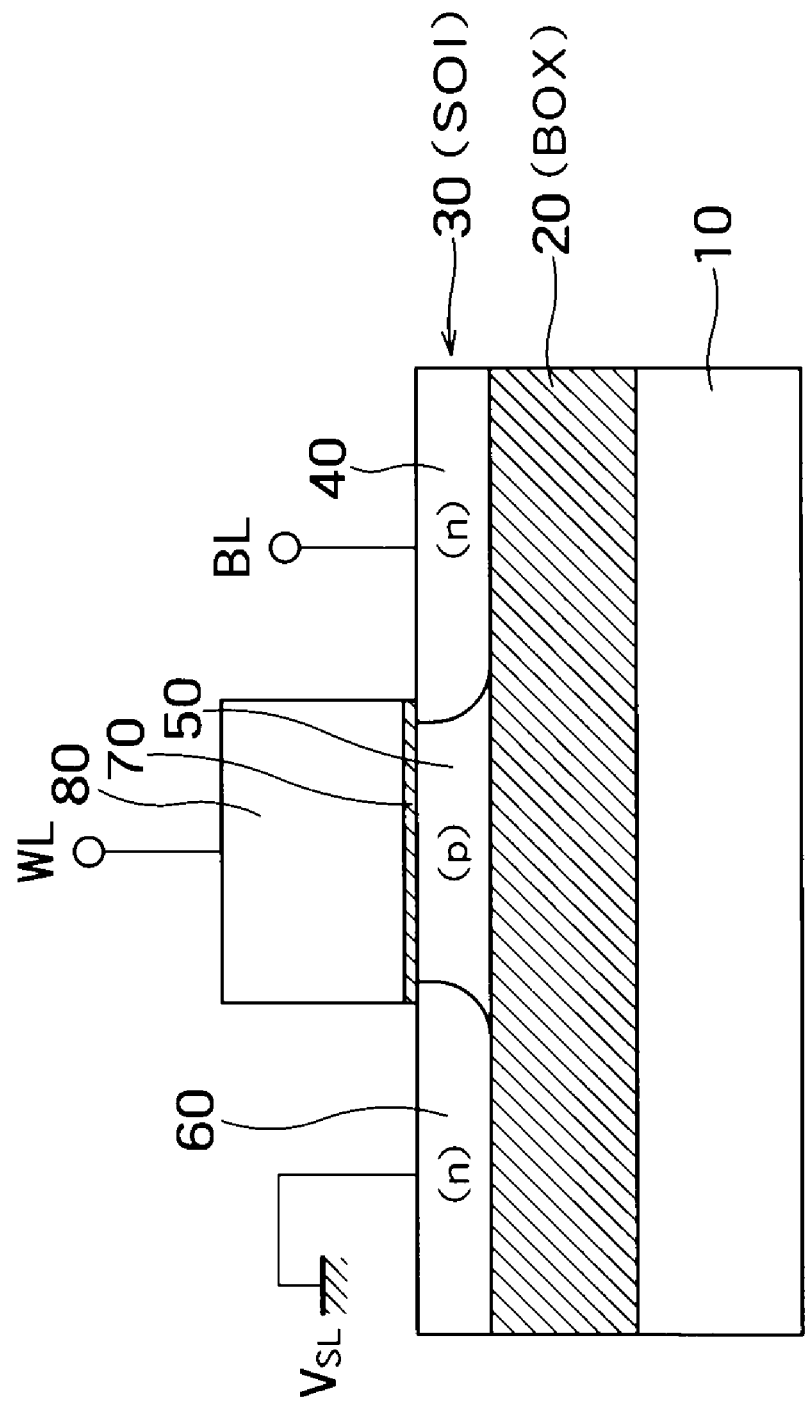
FIG. 2 is a cross-sectional view showing a configuration of each memory cell MC.

FIG. 2 is a cross-sectional view showing a configuration of each memory cell MC. The dummy cells DCs are identical in configuration to the memory cells MCs. The memory cell MC is provided on an SOI substrate including a supporting substrate 10, a BOX layer 20, and an SOI layer 30. A source 60 and a drain 40 are provided in the SOI layer 30. A floating body 50 is formed on the SOI layer 30 between the source 60 and the drain 40. The body 50 is a semiconductor opposite in conduction type to the source 60 and the drain 40. In the first embodiment, the memory cells MCs are N-type FET. The body 50 is surrounded by the source 60, the drain 40, the BOX layer 20, a gate dielectric film 70, and an STI (Shallow Trench Isolation) (not shown) either partially or entirely, whereby the body 50 is in an electrically floating state. The FBC memory device can store logic data (binary data) in each memory cell MC according to the number of majority carriers accumulated in the body 50 of the memory cell MC.

One of methods of writing data to each memory cell MC will be described. To write data "1" to a memory cell MC, the memory cell MC is caused to operate in a saturation state. For example, the word line WL connected to the memory cell MC is biased to 1.5 V and the bit line BL connected to the memory cell MC is biased to 1.5 V. A potential of the source 60 is set to a ground GND (0 V). By so setting, impact ionization occurs near the drain 40 to thereby generate many pairs of electrons and holes. The electrons generated by the impact ionization flow into the drain 40 and the holes are accumulated in the low potential body 50. A body voltage turns into an equilibrium state when a balance is held between a current flowing when the holes are generated by the impact ionization and a forward current at a pn junction between the body 50 and the source 60. The body voltage is about 0.7 V.

To write data "0" to the memory cell MC, the potential of the bit line BL is reduced to a negative voltage. For example, the potential of the bit line BL is reduced to –1.5 V. As a result of this operation, a pn junction between the body 50 and the drain 40 is biased largely in a forward direction, the holes accumulated in the body 50 are discharged to the drain 40, and the data "0" is thereby stored in the memory cell MC.

One of methods of reading data from each memory cell MC will be described. In the data read operation, the word line WL is activated similarly to the data write operation but the potential of the bit line BL is set lower than that during the data write operation for writing data "1" to the memory cell MC. For example, the potential of the word line WL is set to 1.5 V and that of the bit line BL is set to 0.2 V. The memory cell MC is caused to operate in a linear region. A memory cell MC storing therein data "0" ("0" cell) and a memory cell MC storing therein data "1" ("1" cell) differ in threshold voltage due to the difference therebetween in the number of holes accumulated in the body 50. By detecting such a threshold voltage difference, it is possible to discriminate whether data is "1" or "0". The reason for setting the potential of the bit line BL to be low during the data read operation is as follows. If the potential of the bit line BL is set high and the memory cell MC is biased into a saturation state, data "0" is possibly changed to data "1" by the impact ionization if the data "0" is to be read.

Figure 3:
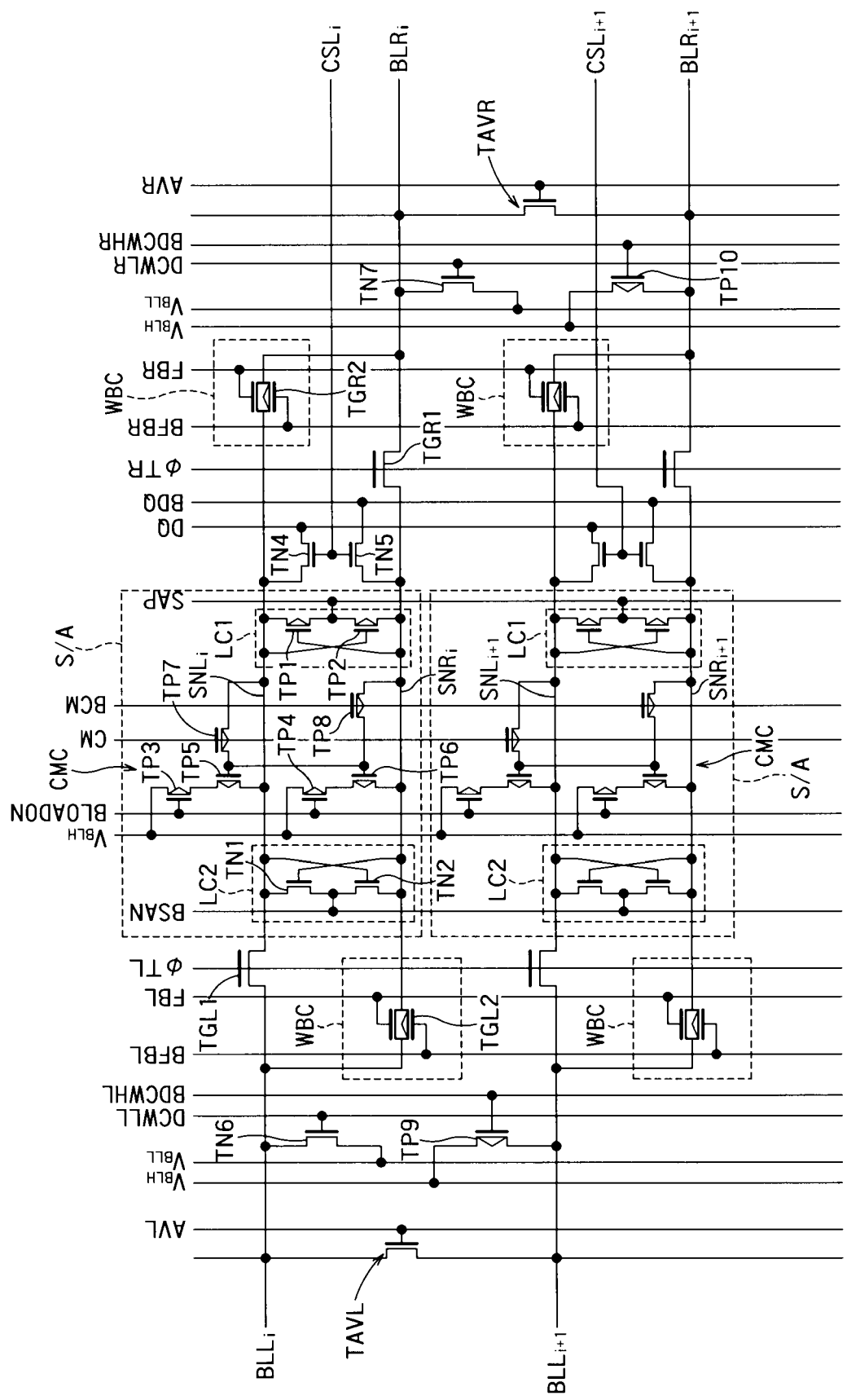
FIG. 3 is a circuit diagram showing a configuration of each sense amplifier S/A and that of peripherals.

FIG. 3 is a circuit diagram showing a configuration of each sense amplifier S/A and that of peripherals. While FIG. 3 shows two sense amplifiers S/As, one of the sense amplifiers S/As will be described herein since they are identical in configuration.

Each sense amplifier S/A is connected to one bit line BLLi and one bit line BLRi provided on the left and right of the sense amplifier S/A, respectively, and is provided to correspond to paired bit lines BBLLi (hereinafter, also "BLL") and BLRi (hereinafter, also "BLR"). As can be understood, the FBC memory device according to the first embodiment adopts an open bit-line structure. Due to this, during the data read operation, one of a pair of bit lines BLL and BLR transmits data whereas the other of the pair transmits reference data.

The sense amplifier S/A includes a pair of sense nodes SNLi (hereinafter, also "SNL") and SNRi (hereinafter, also "SNR"). The sense node SNL is connected to the bit line BLL via a transfer gate TGL1 and to the bit line BLR via a transfer gate TGR2. The sense node SNR is connected to the bit line BLL via a transfer gate TGL2 and to the bit line BLR via a transfer gate TGR1.

The transfer gates TGL1 and TGR1 are controlled to be turned on or off by signals ΦTL and ΦTR, respectively. The transfer gate TGL2 is controlled to be turned on or off by signals FBL and BFBL. The transfer gate TGR2 is controlled to be turned on or off by signals FBR and BFBR. Note that signal B means an inverted signal with respect to a signal .

For example, in the data read operation, the sense amplifier S/A reads data from each memory cell MC, outputs the data to outside of the sense amplifier S/A via a DQ buffer DQB, and writes back the data to the memory cell MC. If the sense amplifier S/A reads data from a "1" cell connected to the bit line BLL corresponding to the sense amplifier S/A, then the transfer gates TGL1 and TGR1 are turned on, and the transfer gates TGL2 and TGR2 are turned off. Since the threshold voltage of the "1" cell is relatively low, a current carried from the sense node SNL to the "1" cell is higher than the reference current Iref. Since a current carried from the sense node SNR to the bit line BLR is equal to the reference current Iref, a potential of the sense node SNL is lower than that of the sense node SNR. The sense amplifier S/A amplifies a potential difference between the sense nodes SNL and SNR and latches the amplified potential difference. On the other hand, to restore the data "1" to the memory cell MC, it is necessary to apply a high potential to the bit line BLL. Therefore, the transfer gate TGL1 is turned off and the transfer gate TGL2 is turned on, thereby connecting the high potential sense node SNR to the bit line BLL.

The sense amplifier S/A includes cross-coupled dynamic latch circuits (hereinafter, "latch circuits") LC1 and LC2. The latch circuit LC1 is configured to include two P-type transistors TP1 and TP2 connected in series between the sense nodes SNL and SNR. A gate of the transistor TP1 is connected to the sense node SNR, and a gate of the transistor TP2 is connected to the sense node SNL. Namely, the gates of the transistors TP1 and TP2 are cross-coupled to the sense nodes SNL and SNR. The latch circuit LC2 is configured to include two N-type transistors TN1 and TN2 connected in series between the sense nodes SNL and SNR. A gate of the transistor TN1 is connected to the sense node SNR, and a gate of the transistor TN2 is connected to the sense node SNL. Namely, the gates of the transistors TN1 and TN2 are cross-coupled to the sense nodes SNL and SNR. The latch circuits LC1 and LC2 are driven by activating signals SAP and BSAN, respectively.

The sense amplifier S/A also includes a current mirror-type current load circuit (hereinafter, "mirror circuit") CMC configured to include P-type transistors TP3 to TP8. The mirror circuit CMC is configured to apply an equal current to the sense nodes SNL and SNR. The transistors TP3 and TP4 are controlled by a load signal BLOADON and function as switching element switching over between a power supply VBLH and the mirror circuit CMC. The power supply VBLH indicates a high potential applied to one bit line BL when data "1" is written to a memory cell MC.

The transistors TP7 and TP8 are controlled by signals CM and BCM, respectively, and connect gates of the transistors TP5 and TP6 to the sense nodes SNL and SNR, respectively. If the sense amplifier S/A is to detect data stored in the memory cells MC connected to the bit line BLL, one dummy cell DC is connected to the bit line BLR. At this time, a potential of the signal BCM is set to a low level potential and that of the signal CM is set to a high level potential. By doing so, a common gate to the transistors TP5 and TP6 is connected to the sense node SNR across which the reference current Iref is carried, so that it is possible to accurately detect the data stored in the memory cells MCs using the reference current Iref. Needless to say, if the sense amplifier S/A is to detect data stored in the memory cells MCs connected to the bit line BLR, then the potential of the signal BCM is set to a high level potential, and that of the signal CM is set to a low level potential.

An N-type transistor TN4 is connected between the DQ line and the sense node SNL, and an N-type transistor TN5 is connected between a BDQ line and the sense node SNR. Gates of the transistors TN4 and TN5 are connected to a column selection line CSLi (hereinafter, also "CSL"). The DQ line and the BDQ line are connected to the DQ buffer. The DQ buffer is connected to an I/O circuit. During the data read operation, the DQ buffer temporarily stores therein data from the memory cells MCs so as to output the data to the outside of the sense amplifier S/A. During the data write operation, the DQ buffer temporarily stores therein data from the outside so as to transmit the data to the sense amplifier S/A. The column selection line CSL is, therefore, activated when data is read to the outside or written from the outside, and enables the sense nodes SNL and SNR to be connected to the DQ buffer. During a refresh operation, the column selection line CSL is kept inactive. The "refresh operation" means an operation for temporarily reading data from each memory cell MC, causing the sense amplifier S/A to latch the data, and writing back data identical in logic to the latched data to the same memory cell MC. The operation for reading data to the outside is identical to the refresh operation except that the column selection line CSL is activated.

In the first embodiment, a write back circuit WBC is configured to include CMOS transfer gates TGL2 and TGR2 that are a P-FET and an N-FET connected in parallel.

An N-type transistor TN6 is connected between the bit line BLLi and a low potential VBLL. A gate of the transistor TN6 is connected to a signal line DCWLL. An N-type transistor TN7 is connected between the bit line BLRi and the low potential VBLL. A gate of the transistor TN7 is connected to a signal line DCWLR. The low potential VBLL indicates a low potential applied to a bit line BL when data "0" is written to a memory cell MC. For example, the low potential VBLL is −1.5 V. Each of the signal lines DCWLL and DCWLR is activated when data "0" is written to one dummy cell DC0. Namely, data "0" is written to the dummy cell DC0 connected to the bit line BLLi or BLRi.

A P-type transistor TP9 is connected between the bit line BLLi+1 and the high potential VBLH. A gate of the transistor TP9 is connected to a signal line BDCWHL. A P-type transistor TP10 is connected between the bit line BLRi+1 and the high potential VBLH. A gate of the transistor TP10 is connected to a signal line BDCWHR. Each of the signal lines BDCWHL and BDCWHR is activated when data "1" is written to one dummy cell DC1. Namely, the data "1" is written to the dummy cell DC1 connected to the bit line BLLi+1 or BLRi+1.

Averaging lines AVL and AVR are connected to gates of each averaging transistor TAVL and each averaging transistor TAVR (hereinafter, also "TAVs"), respectively. Each of the averaging transistors TAVs is connected between two adjacent bit lines BLs, and the averaging transistors TAVs are connected in series. The averaging transistor TAV shorts the dummy cells DC0 and shorts the dummy cells DC1 as many as the dummy cells DC0 during a data read operation, thereby averaging currents carried across the dummy cells DC0 and DC1 and generating the reference current Iref.

Figure 4:
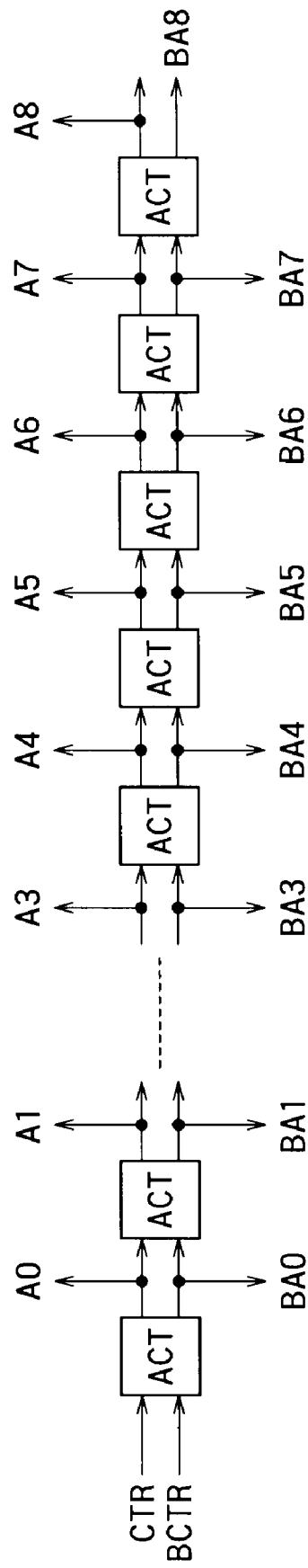
FIG. 4 is a circuit diagram of the row address counter RAC.

FIG. 4 is a circuit diagram of the row address counter RAC. The row address counter RAC is configured to connect a plurality of half adders ACTs to one another. The number of bits of an address output from the row address counter RAC corresponds to the number of half adders ACTs. In the first embodiment, nine half adders ACTs are connected in the row address counter RAC. Therefore, the activation counter AC can output addresses of nine bits (A0 to A8).

The row address counter RAC increments an address by one whenever the signal CTR is activated to high level in the refresh operation. In the refresh operation, therefore, the WLD driver WLD selectively activates the word lines WLs in order of addresses. If the row address is back where it started, it means that all the word lines WLs in the memory cell array MCA are selected, thus completing one refresh operation.

Figure 5:
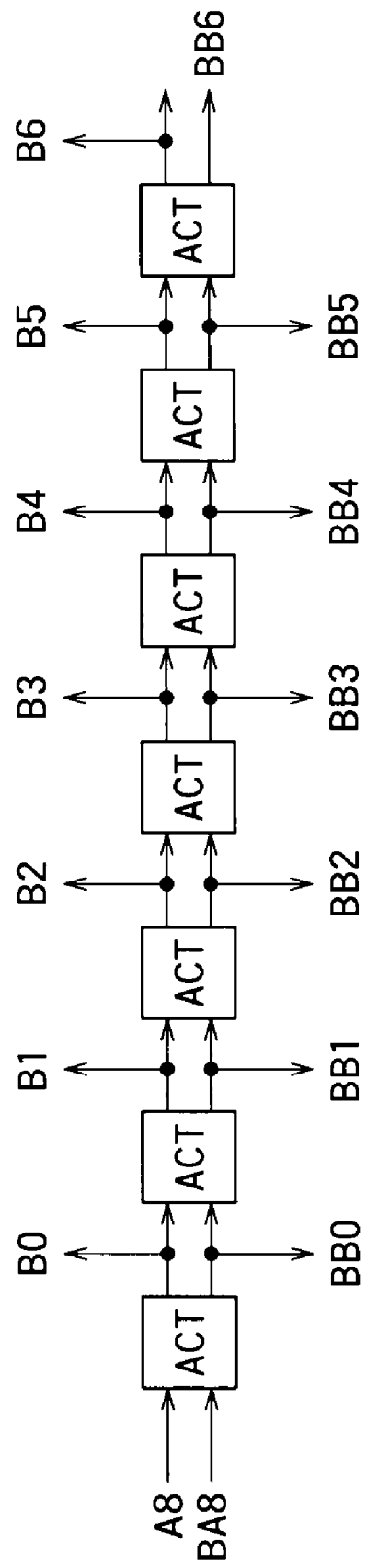
FIG. 5 is a circuit diagram of the activation counter AC.

FIG. 5 is a circuit diagram of the activation counter AC. The activation counter AC is configured to connect a plurality of half adders ACTs to one another similarly to the row address counter RAC. The number of bits of an activation count output from the activation counter AC corresponds to the number of half adders ACTs. In the first embodiment, seven half adders ACTs are connected in the activation counter AC. Therefore, the activation counter AC can output activation counts corresponding to seven bits (B0 to B6). The activation counter AC can thereby calculate the activation count up to 128.

The least significant bit B0 of the activation counter AC receives the most significant bit A8 of the row address counter RAC, and the activation counter AC increments the activation count by one whenever the highest bit A8 is activated to high level. Accordingly, the activation counter AC increments the activation count by one whenever one refresh operation is completed. The activation counts returns to zero when a 128th refresh operation is completed.

In the first embodiment, the bit of the activation count is added to the most significant bit A8 of the row address counter RAC. The activation counter AC is connected to the most-significant half adder ACT of the row address counter RAC. It is thereby possible to constitute the row address counter RAC and the activation counter AC by one 14-bit counter. This 14-bit counter outputs both the row address and the activation count during the refresh operation.

Figure 6:
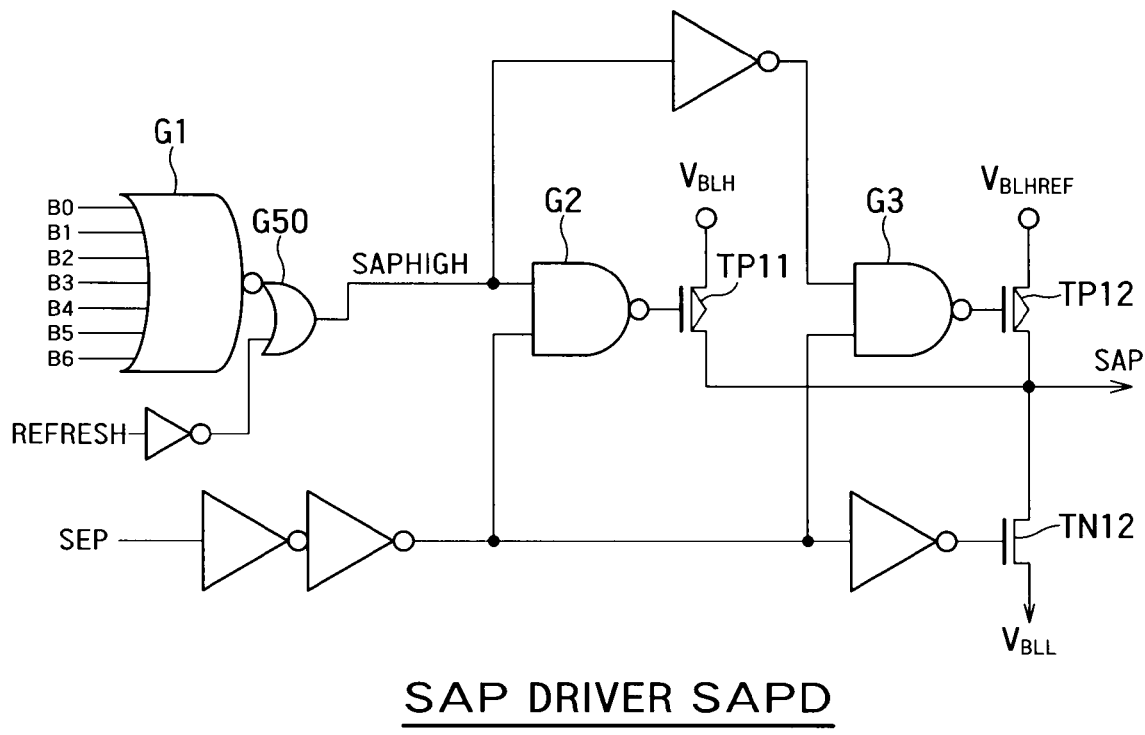
FIG. 6 is a circuit diagram of the SAP driver SAPD.

FIG. 6 is a circuit diagram of the SAP driver SAPD. The SAP driver SAPD is configured to activate the signal SAP to high level during the refresh operation after the activation count reaches 128. More specifically, the SAP driver SAPD includes a NOR gate G1, NAND gates G2 and G3, P-type transistors TP11 and TP12, and an N-type transistor TN12.

The NOR gate G1 rises a signal SAPHIGH to high level when the NOR gate G1 receives the activation count (B0 to B6) from the activation counter AC and all bits of B0 to B6 are equal to "0" during the refresh operation, i.e., while a REFRESH signal is at high level. The signal SAPHIGH is kept to low level when one of the bits B0 to B6 is "1". Therefore, if the activation count reaches a predetermined value of 128, the signal SAPHIGH is at high level. During the operation for reading data to the outside of the sense amplifier S/A (normal data read operation) or the operation for writing data from the outside thereof (normal data write operation), the REFRESH signal is at low level and the signal SAPHIGH is at high level irrespectively of the output of the activation counter AC.

The NAND gate G2 receives signals SAPHIGH and SEP, and activates the transistor TP11 if the signals SAPHIGH and SEP are at high level. The signal SEP is a signal activated when the latch circuit LC1 is driven. Accordingly, in the refresh operation in which the activation count reaches the predetermined value of 128 (hereinafter, "particular refresh operation"), the normal data read operation or the normal data write operation, the SAP driver SAPD outputs a high level potential VBLH (first voltage) or a low level potential VBLL (third voltage) as the signal SAP based on the signal SER In the refresh operation performed when the activation count is smaller than the predetermined value (hereinafter, "normal refresh operation), the signal SAPHIGH is kept to be low level and not activated. The SAP driver SAPD cannot, therefore, output the high level potential VBLH. The OR gate G50 performs an OR operation between an inverted signal of the signal REFRESH that becomes high level in the refresh operations and an output signal from the NAND circuit G1. The OR gate G50 outputs an OR operation result as the signal SAPHIGH. As a result, in the normal data read operation or the normal data write operation other than the refresh operation, the signal SAPHIGH is always at high level.

The NAND gate G3 receives an inverted signal of the signal SAPHIGH and the signal SEP, and activates the transistor TP12 if the inverted signal of the signal SAPHIGH and the signal SEP are at high level. Accordingly, in the normal refresh operation, the SAP driver SAPD outputs a high level potential VBLHREF (second voltage) or the low level potential VBLL as the signal SAP based on the SER Since the signal SAPHIGH is at high level in the particular refresh operation, the normal data read operation or the normal data write operation, the SAP driver SAPD cannot output the high level potential VBLHREF.

The high level potential VBLHREF is a high level potential lower in absolute value than the potential VBLH for writing data "1". In the first embodiment, the high level potential VBLHREF is set to be intermediate between VBLH and VSL. Alternatively, the high level potential VBLHREF can be set equal to a source potential VSL of each memory cell MC. If the high level potential VBLHREF is applied to the latch circuit LC2 as the signal SAP, then the latch circuit LC2 operates but the refresh operation is not performed on the "1" cells.

In this manner, in the normal refresh operation, the SAP driver SAPD outputs the high level potential VBLHREF as the second voltage, whereby the refresh operation is not performed on the "1" cells. In the particular refresh operation, the normal data read operation or the normal data write operation, the SAP driver SAPD outputs the potential VBLH as the first voltage, thereby refreshing the "1" cells or writing data "1" to the memory cells MC.

FIG. 7 is a circuit diagram of the BSAN driver. The BSAN driver outputs the high level potential VBLH or the low level potential VBLL as the signal BSAN on the basis of the signal SEN irrespectively of the normal data read operation, the normal data write operation, the particular refresh operation or the normal refresh operation. In the normal data read operation, the normal data write operation, the normal refresh operation or the particular refresh operation, the BSAN driver outputs the potential VBLL as the third voltage, thereby refreshing "0" cells.

The reason for refreshing only the "0" cells in the normal refresh operation is as follows. As described above, if the data holding state is long, then the number of holes flowing in the body 50 increases, data "0" is deteriorated, but data "1" is not deteriorated. Further, if data is written to selected memory cells MC, the opposite data stored in unselected memory cells MCs sharing the same bit line BL with the selected memory cells MC are often deteriorated. This phenomenon is called "bit line disturb". For example, if data "1" is written to one selected memory cell MC, the "0" cell adjacent to the selected memory cell MC is deteriorated ("1" bit line disturb).

The "1" cell is deteriorated by the charge pumping phenomenon. However, in the normal data read operation to the outside and the normal data write operation from the outside, data is restored or written to all the memory cells MCs connected to the selected word line WL. Moreover, in a period between one refresh operation and the next refresh operation, the word line WL is activated only in the data read operation and the data write operation. Accordingly, in the period between one refresh operation and the next refresh operation, "1" cells are hardly deteriorated. It is, therefore, necessary to perform the refresh operation on "0" cells more frequently than the refresh operation on "1" cells. In the normal refresh operation, therefore, only the "0" cells are subjected to the refresh (restore) operation.

However, in the normal refresh operation, the "1" cells are not subjected to the restore operation. Due to this, if the normal refresh operation is repeatedly executed, the "1" cells may possibly be deteriorated by the charge pumping phenomenon. In the first embodiment, therefore, if the activation count (the number of normal refresh operations) reaches 128, the particular refresh operation is performed. It is thereby possible to suppress deterioration in the "1" cells due to the refresh operation.

The relationship between the activation count of one word line WL and the charge pumping phenomenon will next be described. It is assumed, for example, that a density of interface states between silicon and a silicon oxide film is about $N_{it}=1\times10^{10}$ cm$^{-2}$, and that gate width (W) and gate length (L) of one memory cell MC are both 0.1 µm. In this case, an area of the interface between a body region and a gate dielectric film is about $1.0\times10^{-10}$ cm$^2$ per memory cell MC, and the number of the interface states per memory cell MC is about one on the average. Therefore, the number of holes disappearing in one memory cell MC by activating a word line WL once is about one on the average.

In the FBC memory device, the difference in the number of holes between the data "1" and the data "0" is about 1,000. Accordingly, if a calculational activation count of the word line WL is amount to about 1,000, the data "1" completely changes to data "0". In actuality, if the activation count of the word line WL is equal to about 500, the probability of erroneously detecting the data "1" increases. Substantially, if the activation count of the word line WL exceeds 200 to 500, it is necessary to refresh all the memory cells MCs connected to the word line WL. In the first embodiment, if the activation count reaches 128, the particular refresh operation is executed. A predetermined value of the activation count for executing the particular refresh operation can be arbitrarily selected from among 8, 16, 32, 64, 256, 512, and the like. The predetermined value can be arbitrarily changed by increasing or decreasing the number of half adders ACTs connected to one another in the activation counter AC.

Reasons for setting the potential of the signal SAP to VBLHREF (<VBLH) in the normal refresh operation will be described. First, since there is no need to refresh "1" cells in the normal refresh operation, the high level potential VBLH is unnecessary. Second, by applying the potential VBLHREF lower than the high level potential VBLH to the bit lines BLs, the bit-line disturb ("1" bit-line disturb) is mitigated. Third, by applying the potential VBLHREF lower than the high level potential VBLH to the bit lines BLs, current consumption in the refresh operation is reduced. Fourth, when the potential of the signal SAP is set to VBLHREF (<VBLH), it is possible to replenish the "1" cell body with holes which have been eliminated from the body in the charge-pumping phenomenon. In other words, data "1" is weakly or lightly written back to "1" cells by applying VBLHREF to the bit lines BLs connected to the "1" cells. In this case, since the data in the both polarities are recovered in every normal refresh operation, the activation counter AC is not needed. For these reasons, the potential of the signal SAP is set to VBLHREF in the normal refresh operation. It is thereby possible to reduce the power consumption in the refresh operation.

FIG. 8 is a table showing the difference between the normal refresh operation and the particular refresh operation. In FIG. 8, for brevity, the number of bits of one row address is three (A0 to A2) and the number of bits of one activation count address is two (B0, B1). Further, the word lines WLs are eight word lines WL0 to WL7. In the example of FIG. 8, at (B0, B1)=(0, 0), a particular refresh operation PREF is executed. Namely, if the activation count (number of refresh operations) reaches four, one particular refresh operation PREF is executed.

Since (B0, B1)=(0, 0), the particular refresh operation PREF is performed on all the word lines WL0 to WL7. The potential of the signal SAP is, therefore, VBLH. In next three refresh operations, since (B0, B1)≠(0, 0), a normal refresh operation NREF is executed. At this time, the potential of the signal SAP is VBLHREF. In a fourth refresh operation, the activation counter returns to zero and (B0, B1)=(0, 0). Therefore, the particular refresh operation PREF is executed. By repeating this cycle, one out of the four refresh operations is the particular refresh operation PREF. In other words, if the activation count of one word line WL reaches four in the normal refresh operation, the sense amplifier S/A performs one particular refresh operation.

FIG. 9 is a timing chart showing the particular refresh operation, the normal data read operation or the normal data write operation. In the example of FIG. 9, sense amplifiers S/As detect data from the memory cell array MCAL based on the reference current Iref carried across the dummy cells DCs in the memory cell array MCAR. Needless to say, the sense amplifiers S/As can detect data from the memory cell array MCAR based on the reference current Iref carried across the dummy cells DCs in the memory cell array MCAL.

A signal BRAS is a command signal input from the outside of each sense amplifier S/A and indicates the following respects. If the signal BRAS is at low level, an operation starts in a cycle. By returning the signal BRAS to high level, the operation is finished in the cycle. The signal BRAS can be set either asynchronous or synchronous with a clock signal.

At t1, one word line WLLi is selectively activated. At the same time, the dummy word line DWLR is activated. By setting signals on the equalizing lines EQLs (hereinafter, also "signals EQLs") to low levels, the equalizing transistors TEQLs and TEQRs are turned off, respectively. By doing so, the bit lines BLLs and BLRs shorted to the ground (VSL) are all turned into high impedance states. By setting a signal on the averaging line AVL (hereinafter, also "signal AVL") to low level, the averaging transistors TAVLs shown in FIG. 3 are turned off. As a result, the bit lines BLLi in the memory cell array MCAL are separated from one another. Since the signal AVR is kept to high level, the averaging transistors TAVRs are turned on. As a result, the bit lines BLRi in the memory cell array MCAR are kept connected. By setting the signal BCM to low level, the transistors TP8 are turned on.

At t1, the signals FBL and FBR are set to low levels. The transfer gates TGL2 and TGR2 are turned off. Accordingly, each bit line BLLi is disconnected from the sense node SNRi and each bit line BLRi is also disconnected from the sense node SNLi. However, since the signals ΦTL and ΦTR are at high levels, the transfer gates TGL1 and TGR1 are on-state. Accordingly, each bit line BLLi is kept connected to the sense node SNLi and each bit line BLRi is also kept connected to the sense node SNRi.

The signal BCM is set to low level while keeping the signal CM to high level. By so setting, each mirror circuit CMC applies a current, which is based on the reference current Iref carried to the bit line BLRi, to the bit line BLLi.

In these circumstances, the signal BLOADON is activated to low level. A load current is thereby carried from the high level potential VBLH to each selected memory cell MC via the bit line BLLi and from the high level potential VBLH to the dummy cell DC via the bit line BLRi. The currents passing through the selected memory MC and the dummy cell DC are carried to the source potential VSL.

From t1 to t2, a voltage difference (signal difference) gradually developed between the paired sense nodes SNL and SNR based on data stored in the selected memory cells MC.

When the signal difference exceeds a certain value (t2), the signals ΦTL and ΦTR are set to low levels. As a result, the bit lines BLLi and BLRi are disconnected from the sense nodes SNLi and SNRi, respectively.

Right after the disconnection, the signals SAP and BSAN are activated to drive the latch circuits LC1 and LC2. The latch circuits LC1 and LC2 amplify the developing signal difference between the paired nodes SNL and SNR and latch the amplified signal difference to the paired sense nodes SNL and SNR.

At t3, the feedback signals FBL and BFBL are activated, thereby turning on the transfer gate TGL2. The transfer gate TGL2 remains turned off. As a result, the sense node SNR is connected to the bit line BLL. At the same time, the signal DCWLR is set to high level and the signal BDCWHR is set to low level, thereby alternately setting the bit lines BRLs to low and high levels. As a result, data is restored to the memory cells MCs and the dummy cells DCs. Thereafter, at t5, the FBC memory device returns to a precharge state.

Additionally, in the data read operation to the outside, a column selection line CSLk is raised at t4. As a result, the data is transmitted from the paired sense nodes SNL and SNR corresponding to the column selection line CSLK to the DQ line and the BDQ line (see "read" indicated by a broken line). As shown in FIG. 1B, the DQ buffer re-amplifies the data and outputs the amplified data to the outside via the I/O circuit.

As shown in "write" indicated by a broken line, in the data write operation from the outside, the column selection line CSL is activated and the DQ line or BDQ line transmits the data to the sense amplifier S/A. The normal data read operation or the normal data write operation are identical to the particular refresh operation except for the above-described respects.

Figure 10:
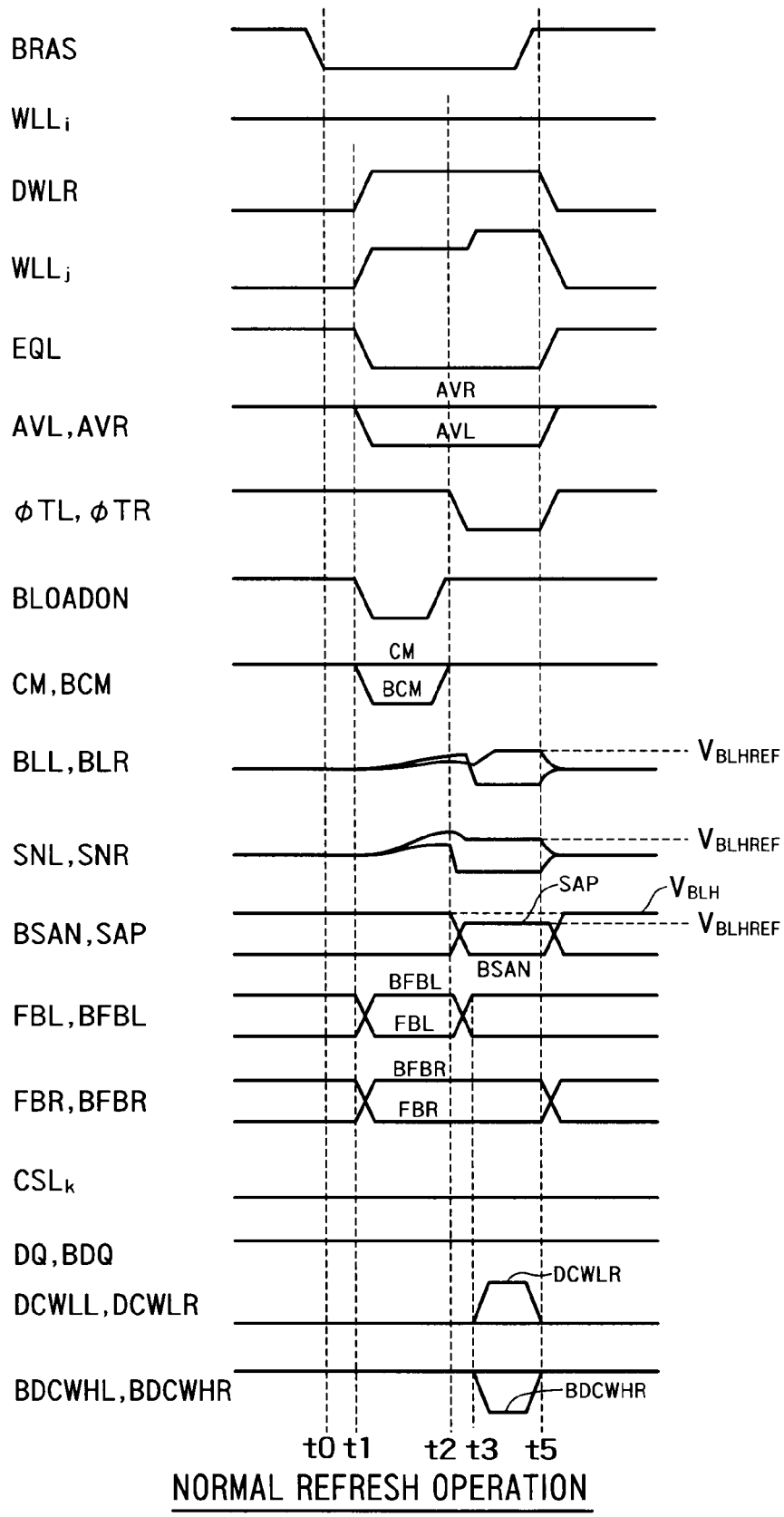
FIG. 10 is a timing chart showing the normal refresh operation.

FIG. 10 is a timing chart showing the normal refresh operation. The normal refresh operation differs from the particular refresh operation in that an activation potential of the signal SAP is VBLHREF. Accordingly, the potential of the sense node SNL or SNR and that of the bit line BLL or BLR during data restore operation (t3 to t5) are VBLHREF. Since the normal refresh operation is identical to the particular refresh operation shown in FIG. 9 in other respects, the identical respects will not be described herein.

In the first embodiment, in the normal refresh operation, potentials of the bit lines BLs connected to the "1" cells are set to VBLHREF lower than the high level potential VBLH. By so setting, only the "0" cells are refreshed without refreshing the "1" cells fully or at all when VBLHREF=VSL, thereby making it possible to reduce power consumption.

In the first embodiment, if the activation count (number of normal refresh operations) of one word line WL reaches the predetermined value, the particular refresh operation is performed. Accordingly, both the "1" cells and the "0" cells are refreshed fully, thereby making it possible to suppress deterioration in the "1" cells due to charge pumping.

As described above, according to the first embodiment, frequencies of the refresh operation on the "1" cells and that on the "0" cells can be independently set. As a result, the refresh operation can be performed on the "1" cells and the "0" cells at necessary time, respectively without deteriorating data stored in the "1" cells and that stored in the "0" cells. This can advantageously suppress power from being wasted in the refresh operation.

It should be noted that the SAP driver SAPD can apply VBLH2 which is between VBLHREF and VBLH in the particular refresh operation.

Second Embodiment

Figure 11:
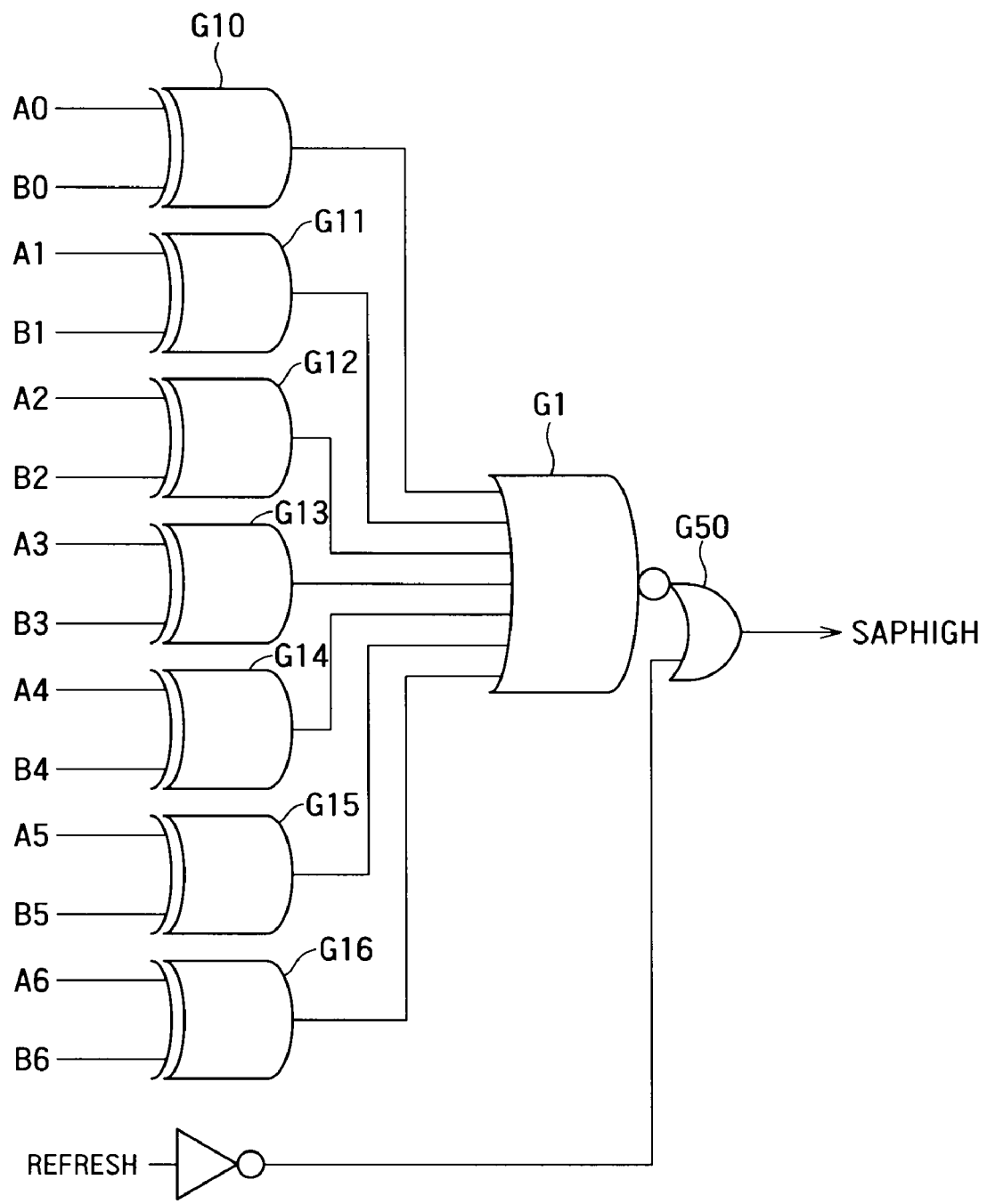
FIG. 11 is a circuit diagram showing a part of an SAP driver SAPD according to a second embodiment of the present invention.

FIG. 11 is a circuit diagram showing a part of an SAP driver SAPD according to a second embodiment of the present invention. In the second embodiment, a particular refresh operation is executed when a combination of bits of a row address counter RAC and bits of an activation counter AC is equal to a predetermined combination. The constituent elements of the FBC memory device other than the SAP driver SAPD according to the second embodiment can be identical to those according to the first embodiment.

In the second embodiment, outputs of exclusive-OR gates G10 to G16 are connected to an input of the NOR gate G1 shown in FIG. 6. One input of each of the exclusive-OR gates G10 to G16 receives each of A0 to A6, and the other input thereof receives each of B0 to B6. By so configuring, if a condition of A0=B0, A1=B1, A2=B2, A3=B3, A4=B4, A5=B5, and A6=B6 is satisfied in the refresh operation, the gate G1 activates the signal SAPHIGH to high level. The operation for activating the signal SAPHIGH is identical to that according to the first embodiment.

FIG. 12 is a table showing the difference between the normal refresh operation and the particular refresh operation according to the second embodiment. In FIG. 12, for brevity, the number of bits of the row address is three (A0 to A2) and the number of bits of the activation count address is two (B0, B1). Further, the word lines WLs are eight word lines WL0 to WL7. In the example of FIG. 12, if a condition of B0=A0 and B1=A1 is satisfied, the particular refresh operation PREF is executed. In FIG. 12, refresh operations on the word lines WLs indicated by arrows correspond to particular refresh operations PREF. On the other word lines WLs, the normal refresh operations NREF are performed.

In the first embodiment, the particular refresh operation is continuously performed on all the word lines WLs. In the second embodiment, the particular refresh operation PREF is distributed to the respective word lines WLs. However, the second embodiment is identical to the first embodiment in that one particular refresh operation PREF is executed when the activation count of one word line WL reaches four. Namely, the particular refresh operation PREF is executed at the same frequency as that according to the first embodiment.

Conditions for executing the particular refresh operation PREF can be variously changed by changing a circuit configuration of the SAP driver SAPD.

Modifications of Sense Amplifier S/A

Figure 13:
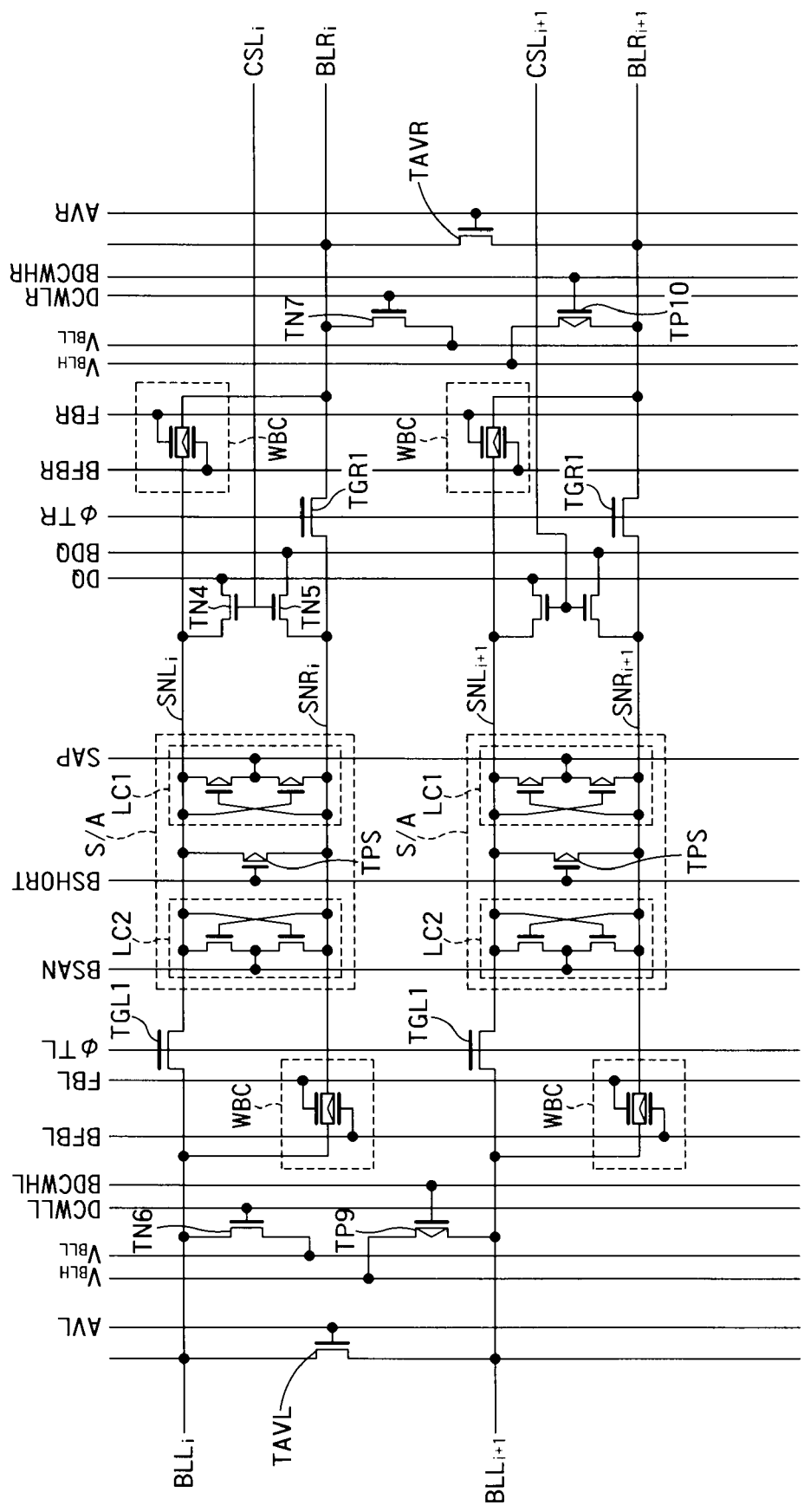
FIGS. 13 to 15 are circuit diagrams showing configurations of the sense amplifiers S/As and that of peripherals according to modifications of the first and the second embodiments.
Figure 14:
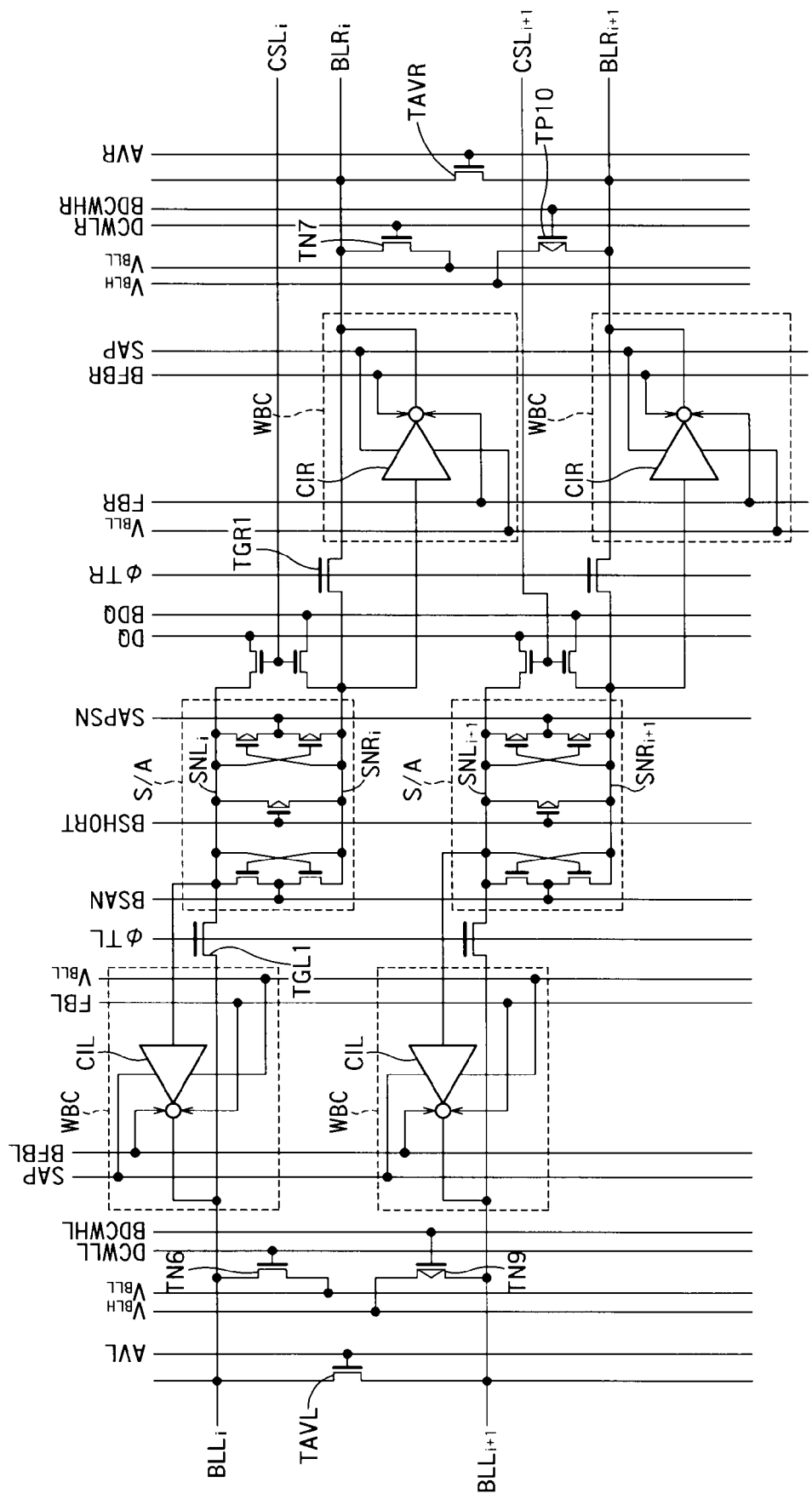
Figure 15:
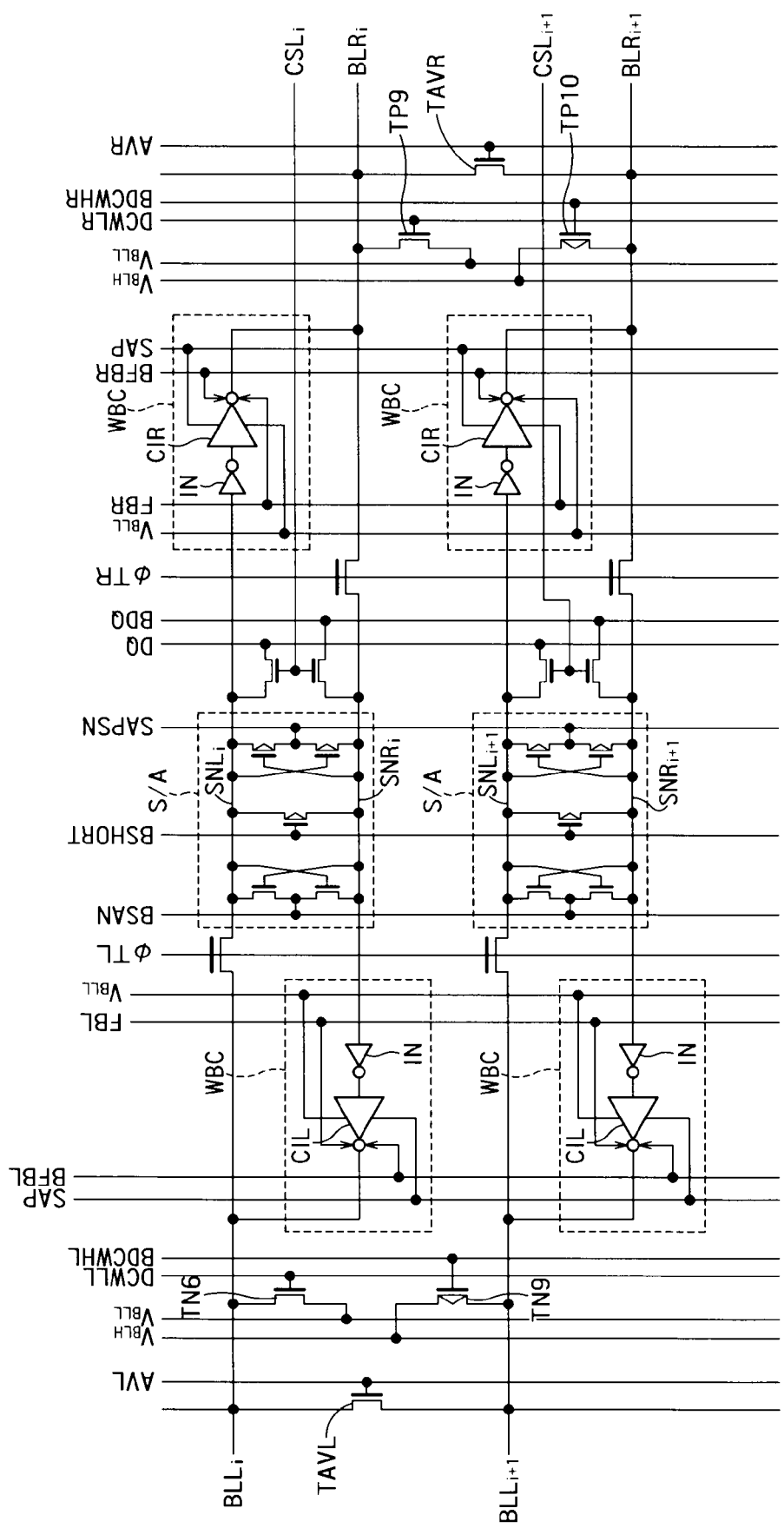

The configuration of each of the sense amplifiers S/As according to each of the first and second embodiments shown in FIG. 3 can be replaced by those shown in FIGS. 13 to 15. Each of the sense amplifiers S/As shown in FIG. 13 does not include a mirror circuit, and a transistor TPS is connected between the sense nodes SNL and SNR. The transistor TPS causes a short-circuit between the paired sense nodes SNL and SNR based on a signal BSHORT. The signal BSHORT is activated to low level in a precharge operation. Other circuit configurations shown in FIG. 13 are identical to those shown in FIG. 3. In the sense amplifier S/A shown in FIG. 13, the latch circuit LC1 or LC2 acts also as a current load circuit, which carries a current to each memory cell MC. The circuits shown in FIG. 13 can thereby perform the same operation as those according to the first embodiment.

Each of the sense amplifiers S/As shown in FIG. 14 is identical to that shown in FIG. 13 with respect to the part for data sensing. However, circuit configurations shown in FIG. 14 differ from those shown in FIG. 13 in that each write back circuit WBC is configured to include clocked inverters CIL and CIR. The clocked inverter CIL inverts a potential of the sense node SNL at a timing of activating the signals FBL and BFBL and transmits the inverted potential of the sense node SNL to the corresponding bit line BLL. The clocked inverter CIR inverts a potential of the sense node SNR at a timing of activating the signals FBR and BFBR and transmits the inverted potential of the sense node SNR to the corresponding bit line BLR. The circuits shown in FIG. 14 can thereby perform the same operation as those according to the first embodiment.

Each of the sense amplifiers S/As shown in FIG. 15 is identical to that shown in FIG. 13 with respect to the part for data sensing. However, circuit configurations shown in FIG. 15 differ from those shown in FIG. 13 in that each write back circuit WBC is configured to include a clocked inverter CIL or CIR and an inverter IN. An input of the clocked inverter CIL is connected to the sense node SNR via the inverter IN, and an input of the clocked inverter CIR is connected to the sense node SNL via the inverter IN. The clocked inverter CIL thereby inverts an inverted potential of the sense node SNR at a timing of activating the signals FBL and BFBL and transmits the further inverted potential to the corresponding bit line BLL. The clocked inverter CIR thereby inverts an inverted potential of the sense node SNL at a timing of activating the signals FBR and BFBR and transmits the further inverted potential to the corresponding bit line BLR. The circuit shown in FIG. 15 can thereby perform the same operation as that according to the first embodiment.

Third Embodiment

Figure 16:
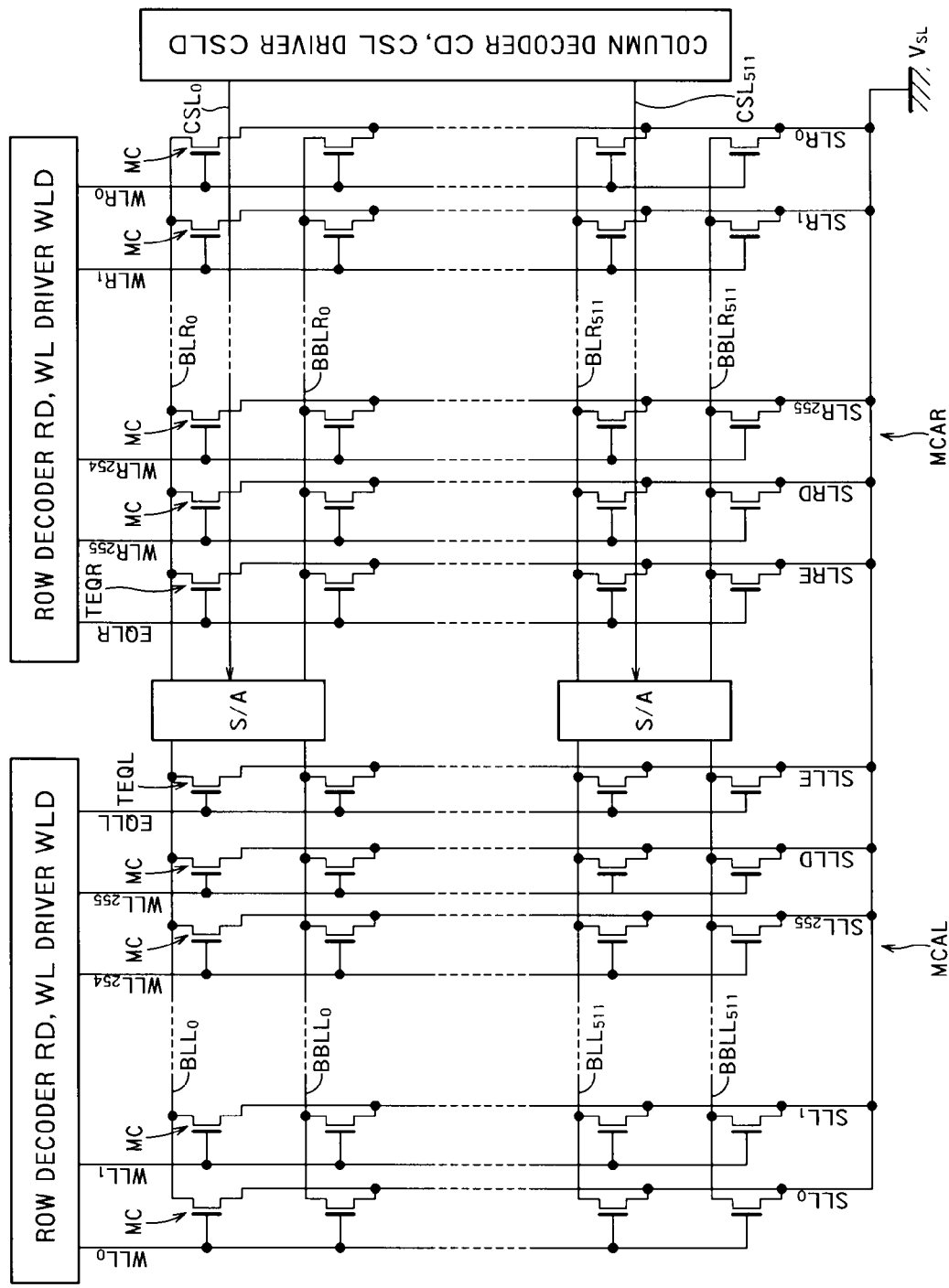
FIG. 16 shows a configuration of an FBC memory device according to a third embodiment of the present invention.

FIG. 16 shows a configuration of an FBC memory device according to a third embodiment of the present invention. The third embodiment is an embodiment in which a so-called twin cell architecture is applied to the first embodiment. The twin cell architecture is also referred to as "2 cell/bit architecture". In this architecture, data opposite in logic is stored in a pair of two memory cells MCs, respectively, thereby storing one-bit data. Each sense amplifier S/A sets one of the two data opposite in logic as reference data and detects the other data based on the reference data. In the twin cell architecture, therefore, there is no need to provide dummy cells DCs, dummy word lines DWLs, averaging lines AVL and AVR, and averaging transistors TAVGLs and TAVGRs. In the third embodiment, memory cells MCs each storing therein data "1" and those storing therein data "0" are provided in adjacent bit lines on one side of the sense amplifiers S/As.

Configurations of a row address counter RAC, an activation counter AC, an SAP driver SAPD, and other peripherals according to the third embodiment can be identical to those according to the first embodiment (FIG. 1B).

Figure 17:
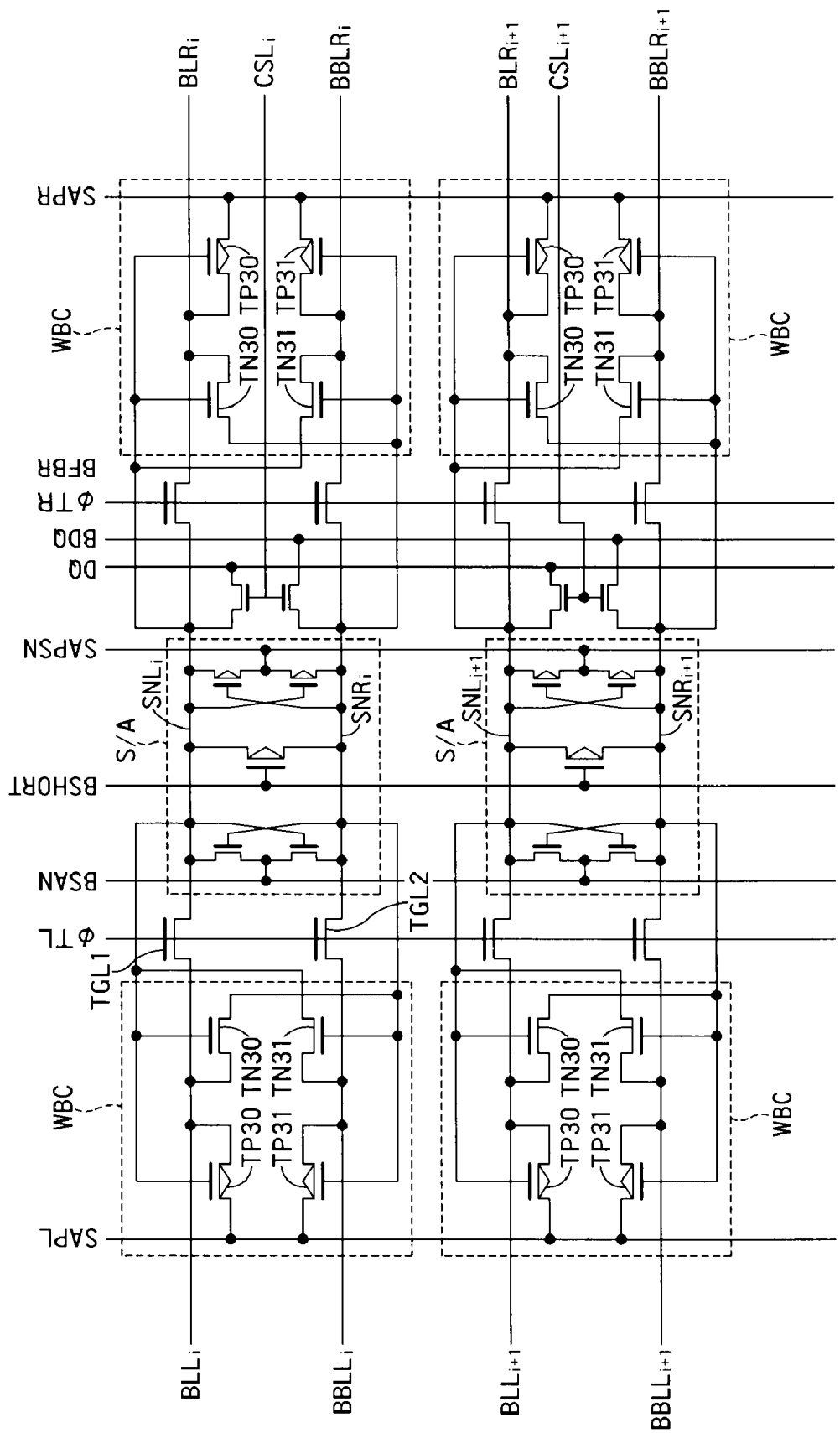
FIGS. 17 and 18 are circuit diagrams showing configurations of the sense amplifiers S/As and the peripherals according to the third embodiment.
Figure 18:
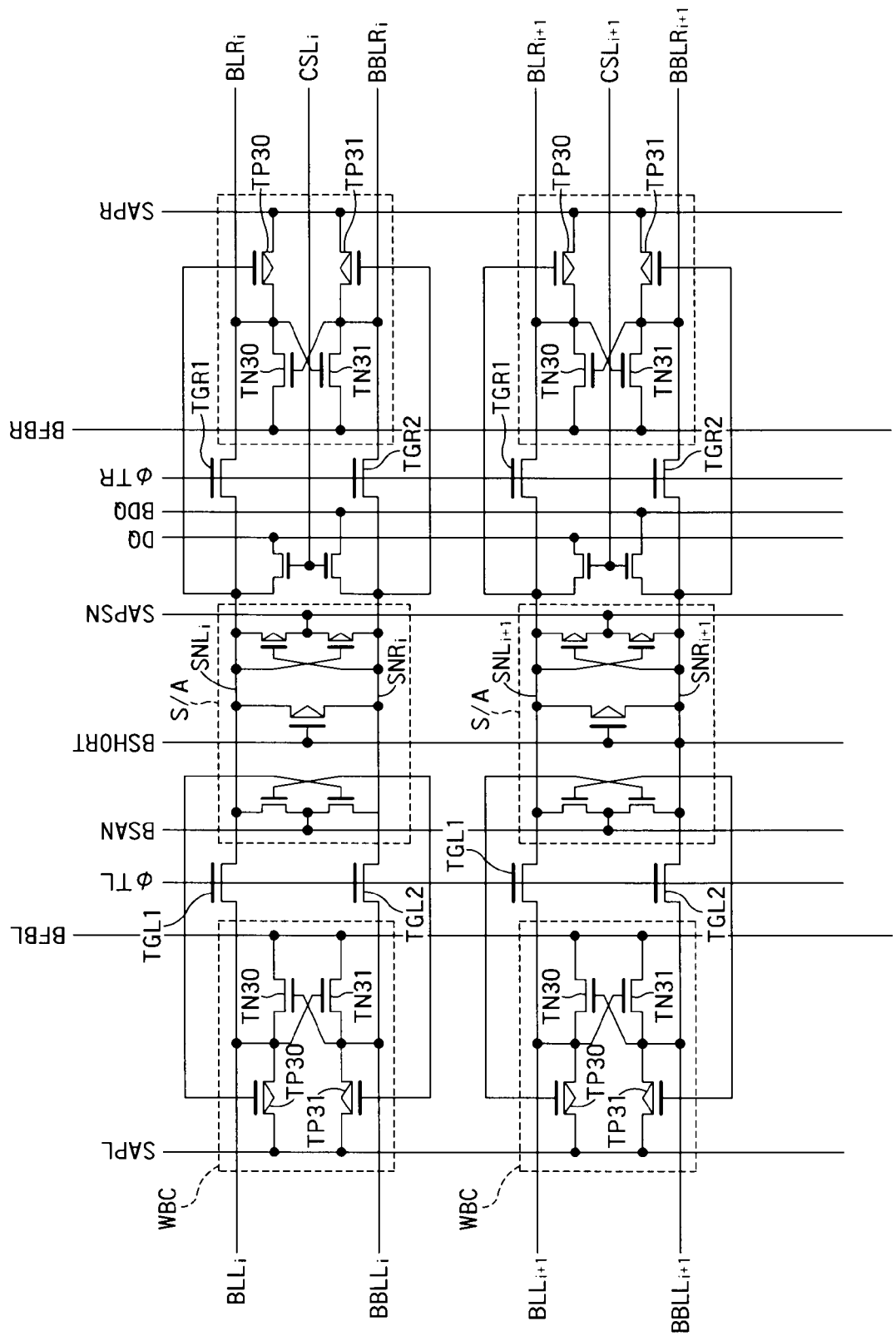

FIGS. 17 and 18 are circuit diagrams showing configurations of the sense amplifiers S/As and the peripherals according to the third embodiment.

In FIG. 17, bit lines BLL and BBLL corresponding to one sense amplifier S/A are connected to sense nodes SNL and SNR via transfer gates TGL1 and TGL2, respectively. Bit lines BLR and BBLR corresponding to one sense amplifier S/A are connected to the sense nodes SNL and SNR via transfer gates TGR1 and TGR2, respectively.

Each write back circuit WBC is configured to include P-type transistors TP30 and TP31 and N-type transistors TN30 and TN31. The P-type transistor TP30 is connected between a signal line SAPL and one bit line BLL and a gate of the transistor TP30 is connected to the sense node SNL. The P-type transistor TP31 is connected between the signal line SAPL and one bit line BBLL and a gate of the transistor TP31 is connected to the sense node SNR. The N-type transistor TN30 is connected between the sense node SNR and one bit line BLL and a gate of the transistor TN30 is connected to the sense node SNL. The N-type transistor TN31 is connected between the sense node SNL and one bit line BBLL and a gate of the transistor TN31 is connected to the sense node SNR.

If the memory cell array MCAL is selected during data detection, the signal ΦTL is activated to turn on the transfer gates TGL1 and TGL2. Memory cells MCs connected to the bit lines BLL and BBLL, respectively store therein data opposite in logic to each other. Accordingly, the data opposite in logic is transmitted to the paired sense nodes SNL and SNR, respectively. Each sense amplifier S/A can thereby set one of the data opposite in logic as reference data and detect the other data based on the reference data.

To write back data, data "0" is written to the memory cells MCs using the sense nodes SNLs or SNRs, respectively, and data "1" is written to the memory cells MCs using the signal SAPL. It is assumed, for example, that the memory cells MCs connected to the bit lines BLLs are "1" cells and those connected to the bit lines BBLLs are "0" cells. In this case, the sense nodes SNLs are lower in potential than the sense nodes SNRs. Accordingly, each transistor TP30 is turned on to connect the high potential signal SAPL to one bit line BLL. Data "1" is thereby written back (restored) to the memory cells MCs connected to the bit line BLL. Further, since the sense node SNRs are high in potential, each transistor TN31 is turned on to connect the low potential sense node SNL to one bit line BBLL. Data "0" is thereby restored to the memory cells MCs connected to the bit line BBLL.

Other operations in the third embodiment can be the same to those in the first or second embodiments. Therefore, the third embodiment can achieve the effects of the first and second embodiments while having the configuration of the twin cell architecture.

Each of write back circuits WBCs shown in FIG. 18 differs in configuration to the write back circuits WBCs shown in FIG. 17. Other configurations of circuits shown in FIG. 18 can be the same to those shown in FIG. 17. In each write back circuit WBC shown in FIG. 18, a transistor TN30 is connected between the signal line BFBL and one bit line BLL and a gate of the transistor TN30 is connected to one bit line BBLL. A transistor TN31 is connected between the signal line BFBL and the bit line BBLL and a gate of the transistor TN31 is connected to the bit line BLL. The signal line BFBL is one used to write data "0".

A data detection operation performed by the circuits shown in FIG. 18 is identical to that performed by the circuits shown in FIG. 17. To write back data, one of the transistors TN30 and TN31 connects the signal line BFBL to one bit line BLL or BBLL so as to write data "0". Further, one of the transistors TN30 and TN31 connects the signal line SAPL to the other bit line so as to write data "1".

Each of the write back circuits WBCs shown in FIG. 18 can restore data "0" and "1" using a potential different from those of the paired sense nodes SNL and SNR. Other operations performed by the circuits shown in FIG. 18 are identical to those performed by the circuits shown in FIG. 17. Therefore, even if the FBC memory device according to the third embodiment includes the circuits shown in FIG. 18, the FBC memory device can exhibit the same advantages.

In the first to third embodiments, each of the FBC memory devices can further include a timer calculating a period of a standby state or a data holding state in which none of the normal data reading operation to the outside and the normal data write operation from the outside are performed. Each sense amplifier S/A regularly executes the normal refresh operation during the period of the standby state or the data holding state. Each sense amplifier S/A can execute the particular refresh operation according to the activation count of each word line WL similarly to the preceding embodiments.

The execution cycle of the particular refresh operation can be decided independently of that of the normal refresh operation. Therefore, each sense amplifier S/A can regularly execute the normal refresh operation and the particular refresh operation using two timers without the activation counter AC, respectively. In this case, the execution cycle of the particular refresh operation is set several times to several hundreds of times as long as that of the normal refresh operation. By so setting, the FBC memory device can exhibit the same advantages as those according to the first to third embodiments.

In the first to third embodiments, each memory cell MC of the FBC memory devices is the N-type FET. Alternatively, each memory cell MC of the FBC memory device can be a P-type FET. In this alternative, polarities of operating voltages are inverted and roles of the signals SAP and BSAP are interchanged. For example, an activation voltage of the signal BSAN in the particular refresh operation is designed to be changed to a voltage higher in absolute value than that in the normal refresh operation.

Moreover, even if the memory cells MCs of the FBC memory device are N-type FETs, the normal refresh operation can be often performed only on the "1" cells depending on potential levels of the word lines WLs and the bit lines BLs in the data holding state. For example, in the data holding state, a body potential of each "0" cell is often equal to a source potential and a drain potential thereof while a forward bias is applied between the body and the source or between the body and the drain of each "1" cell. In this case, the particular refresh operation can be identical with the normal refresh operation. Namely, the particular refresh operation and the normal refresh operation can be always performed only on "1" cells without discrimination between the particular refresh operation and the normal refresh operation. In this case, therefore, it suffices that the signal REFRESH is always set to low level and the signal SEN is set to low level in the refresh operation in the BSAN driver BSAND.

The invention claimed is:

1. A semiconductor memory device comprising:
a plurality of memory cells including floating bodies in an electrically floating state, logic data according to the number of carriers accumulated in the floating bodies being stored in the memory cells;
a plurality of word lines connected to gates of the memory cells;
a plurality of bit lines connected to the memory cells and transmitting data stored in the memory cells; and
a plurality of sense amplifiers connected to the bit lines, and applying a first voltage to the bit lines when first logic data is written to the memory cells connected to the bit lines, wherein
the sense amplifiers apply a second voltage to the memory cells having stored therein the first logic data during a refresh operation in which at least second logic data stored in the memory cells is recovered,
the second logic data is opposite in logic to the first logic data, and
the second voltage is lower in absolute value than the first voltage and equal to or higher in absolute value than a potential of sources of the memory cells.

2. The semiconductor memory device according to claim 1, wherein
the sense amplifiers apply a third voltage to the bit lines connected to the memory cells storing the second logic data, and
the sense amplifiers write back the second logic data to the memory cells storing therein the second logic data by applying the third voltage to the corresponding bit line in the refresh operation.

3. The semiconductor memory device according to claim 2, further comprising:
a counter calculating an activation count of the word lines in the refresh operation, wherein
if the activation count of one of the word lines reaches a predetermined value in the refresh operation, the sense amplifiers apply the first voltage to the bit lines so as to write back the first logic data to the memory cells storing therein the first logic data, and apply the third voltage to the bit lines so as to write back the second logic data to the memory cells storing therein the second logic data.

4. The semiconductor memory device according to claim 2, further comprising:
a counter calculating an activation count of the word lines in the refresh operation, wherein
if the activation count of one of the word lines is smaller than a predetermined value in the refresh operation, the sense amplifiers apply the second voltage to the bit lines so as not to write back the first logic data to the memory cells storing therein the first logic data, and apply the third voltage to the bit lines so as to write back the second logic data to the memory cells storing therein the second logic data.

5. The semiconductor memory device according to claim 3, wherein
if the activation count of one of the word lines is smaller than a predetermined value in the refresh operation, the sense amplifiers apply the second voltage to the bit lines so as not to write back the first logic data to the memory cells storing therein the first logic data, and apply the third voltage to the bit lines so as to write back the second logic data to the memory cells storing therein the second logic data.

6. The semiconductor memory device according to claim 2, further comprising:
a counter calculating an activation count of the word lines in the refresh operation, wherein
if an address bit of one of the word lines to be activated and a counter bit indicating the activation count of the word lines satisfy a predetermined condition, the sense amplifiers apply the first voltage to the bit lines so as to write back the first logic data to the memory cells storing therein the first logic data, or apply the third voltage to the bit lines so as to write back the second logic data to the memory cells storing therein the second logic data.

7. The semiconductor memory device according to claim 2, further comprising:
a counter calculating an activation count of the word lines in the refresh operation, wherein
if an address bit of one of the word lines to be activated and a counter bit indicating the activation count of the word lines do not satisfy a predetermined condition, the sense amplifiers apply the second voltage to the bit lines so as not to write back the first logic data to the memory cells storing therein the first logic data, or apply the third voltage to the bit lines so as to write back the second logic data to the memory cells storing therein the second logic data.

8. The semiconductor memory device according to claim 6, wherein
if an address bit of one of the word lines to be activated and a counter bit indicating the activation count of the word lines do not satisfy a predetermined condition, the sense amplifiers apply the second voltage to the bit lines so as not to write back the first logic data to the memory cells storing therein the first logic data, or apply the third voltage to the bit lines so as to write back the second logic data to the memory cells storing therein the second logic data.

9. The semiconductor memory device according to claim 1, further comprising a timer measuring a period of a standby state or a data holding state in which none of an operation for reading data to outside, an operation for writing the data from the outside are executed, wherein
the sense amplifiers execute the refresh operation periodically during the period of the standby state or the data holding state.

10. The semiconductor memory device according to claim 3, further comprising a timer measuring a period of a standby state or a data holding state in which none of an operation for reading data to outside, an operation for writing the data from the outside are executed, wherein
the sense amplifiers execute the refresh operation periodically during the period of the standby state or the data holding state.

11. The semiconductor memory device according to claim 1, wherein
the memory cells are floating body cells constituted by N-type FETs,
holes are accumulated in the floating bodies of the memory cells when the first logic data is written to the memory cells, and
the holes are discharged from the floating bodies of the memory cells when the second logic data is written to the memory cells.

* * * * *